United States Patent
Ganjoo et al.

(10) Patent No.: US 12,032,124 B2
(45) Date of Patent: Jul. 9, 2024

(54) FLASH ANNEALING OF TRANSPARENT CONDUCTIVE OXIDE AND SEMICONDUCTOR COATINGS

(71) Applicant: Vitro Flat Glass LLC, Cheswick, PA (US)

(72) Inventors: Ashtosh P. Ganjoo, Allison Park, PA (US); Patrick Fisher, Pittsburgh, PA (US); Sudarshan Narayanan, Pittsburgh, PA (US)

(73) Assignee: Vitro Flat Glass LLC, Cheswick, PA (US)

( * ) Notice: Subject to any disclaimer, the term of this patent is extended or adjusted under 35 U.S.C. 154(b) by 0 days.

(21) Appl. No.: 15/669,225

(22) Filed: Aug. 4, 2017

(65) Prior Publication Data

US 2019/0041550 A1  Feb. 7, 2019

(51) Int. Cl.
| | | |
|---|---|---|
| *G02B 1/12* | (2006.01) | |
| *C03C 17/22* | (2006.01) | |
| *C03C 17/245* | (2006.01) | |
| *C03C 17/34* | (2006.01) | |
| *C23C 14/08* | (2006.01) | |
| *C23C 16/40* | (2006.01) | |
| *C23C 16/455* | (2006.01) | |
| *H01B 1/00* | (2006.01) | |
| *H10K 71/60* | (2023.01) | |
| *H10K 77/10* | (2023.01) | |
| *H10K 102/10* | (2023.01) | |

(52) U.S. Cl.
CPC ............... *G02B 1/12* (2013.01); *C03C 17/22* (2013.01); *C03C 17/245* (2013.01); *C03C 17/2453* (2013.01); *C03C 17/34* (2013.01); *C03C 17/3417* (2013.01); *C23C 14/081* (2013.01); *C23C 14/086* (2013.01); *C23C 16/403* (2013.01); *C23C 16/407* (2013.01); *C23C 16/45557* (2013.01); *H01B 1/00* (2013.01); *H10K 71/60* (2023.02); *C03C 2217/231* (2013.01); *C03C 2217/948* (2013.01); *C03C 2218/156* (2013.01); *C03C 2218/32* (2013.01); *C03C 2218/34* (2013.01); *H10K 77/10* (2023.02); *H10K 2102/103* (2023.02)

(58) Field of Classification Search
CPC .......................................................... G02B 1/12
See application file for complete search history.

(56) References Cited

U.S. PATENT DOCUMENTS

| | | | |
|---|---|---|---|
| 3,655,545 A | 4/1972 | Gillery et al. | |
| 4,193,236 A | 3/1980 | Mazzoni et al. | |
| 4,379,040 A | 4/1983 | Gillery | |
| 4,464,874 A | 8/1984 | Shea, Jr. et al. | |

(Continued)

FOREIGN PATENT DOCUMENTS

| | | |
|---|---|---|
| CN | 101413099 A | 4/2009 |
| CN | 102959120 A | 3/2013 |

(Continued)

*Primary Examiner* — Austin Murata
(74) *Attorney, Agent, or Firm* — The Webb Law Firm

(57) ABSTRACT

Methods of processing coated articles, such as transparencies, are provided comprising flash annealing one or more layers of the coated article. The one or more layers may be reflective metallic layers, such as silver layers, or comprise a transparent conductive oxide, such as indium tin oxide, or a semiconductor.

9 Claims, 19 Drawing Sheets

(56) References Cited

U.S. PATENT DOCUMENTS

| | | |
|---|---|---|
| 4,466,562 A | 8/1984 | DeTorre |
| 4,671,155 A | 6/1987 | Goldinger |
| 4,746,347 A | 5/1988 | Sensi |
| 4,792,536 A | 12/1988 | Pecoraro et al. |
| 4,861,669 A | 8/1989 | Gillery |
| 4,898,789 A | 2/1990 | Finley |
| 4,898,790 A | 2/1990 | Finley |
| 4,900,633 A | 2/1990 | Gillery |
| 4,920,006 A | 4/1990 | Gillery |
| 4,938,857 A | 7/1990 | Gillery |
| 5,030,593 A | 7/1991 | Heithoff |
| 5,030,594 A | 7/1991 | Heithoff |
| 5,088,258 A | 2/1992 | Schield et al. |
| 5,106,663 A | 4/1992 | Box |
| 5,240,886 A | 8/1993 | Gulotta et al. |
| 5,328,768 A | 7/1994 | Goodwin |
| 5,385,872 A | 1/1995 | Gulotta et al. |
| 5,393,593 A | 2/1995 | Gulotta et al. |
| 5,492,750 A | 2/1996 | Shumaker, Jr. et al. |
| 6,436,541 B1 | 8/2002 | Sopko et al. |
| 7,910,229 B2 | 3/2011 | Medwick et al. |
| 9,604,875 B2 | 3/2017 | Polcyn et al. |
| 9,627,652 B2 | 4/2017 | Bhandari et al. |
| 2003/0013280 A1 | 1/2003 | Yamanaka |
| 2004/0259326 A1 | 12/2004 | Hideo |
| 2007/0281105 A1* | 12/2007 | Mokhlesi ............... C23C 16/40 427/569 |
| 2010/0127256 A1 | 5/2010 | Inoue et al. |
| 2011/0117300 A1 | 5/2011 | Wagner |
| 2012/0021149 A1 | 1/2012 | Myli et al. |
| 2012/0094075 A1 | 4/2012 | Peter et al. |
| 2013/0196466 A1 | 8/2013 | Zhao et al. |
| 2013/0267060 A1 | 10/2013 | Dauson et al. |
| 2013/0323442 A1 | 12/2013 | Krasnov |
| 2014/0106232 A1* | 4/2014 | Teeters ................. H01L 51/441 429/232 |
| 2014/0199496 A1 | 7/2014 | Gross et al. |
| 2014/0272465 A1 | 9/2014 | Lienhart et al. |
| 2014/0329072 A1 | 11/2014 | Hirasawa et al. |
| 2014/0332254 A1 | 11/2014 | Pellerite et al. |
| 2016/0060163 A1 | 3/2016 | Burrows et al. |
| 2016/0060948 A1 | 3/2016 | Burrows et al. |
| 2016/0229741 A1* | 8/2016 | Canova ............... C03C 17/3423 |
| 2017/0291848 A1* | 10/2017 | Canova ................. H01L 21/268 |
| 2018/0004058 A1 | 1/2018 | Dubrenat et al. |
| 2018/0067373 A1* | 3/2018 | Kimura ................... G02F 1/167 |

FOREIGN PATENT DOCUMENTS

| | | |
|---|---|---|
| CN | 103451618 A | 12/2013 |
| CN | 203773521 U | 8/2014 |
| CN | 104064257 A | 9/2014 |
| CO | 7500130 A2 | 1/2016 |
| DE | 102011005760 A1 | 9/2012 |
| FR | 3025936 A1 | 3/2016 |
| FR | 3031197 A1 | 7/2016 |
| JP | H3157976 A | 7/1991 |
| JP | H06140650 A | 5/1994 |
| JP | H09283468 A | 10/1997 |
| JP | 5447098 B2 | 3/2014 |
| JP | 2015505790 A | 2/2015 |
| TW | 200742768 A | 11/2007 |
| WO | 2014164695 A1 | 10/2014 |
| WO | 2017078911 A1 | 5/2017 |

* cited by examiner

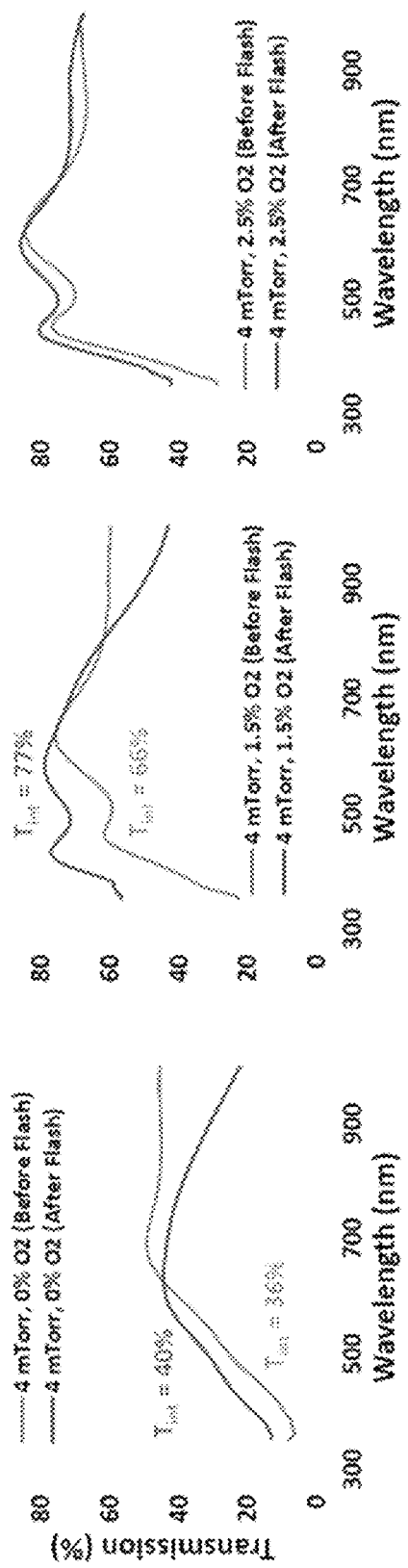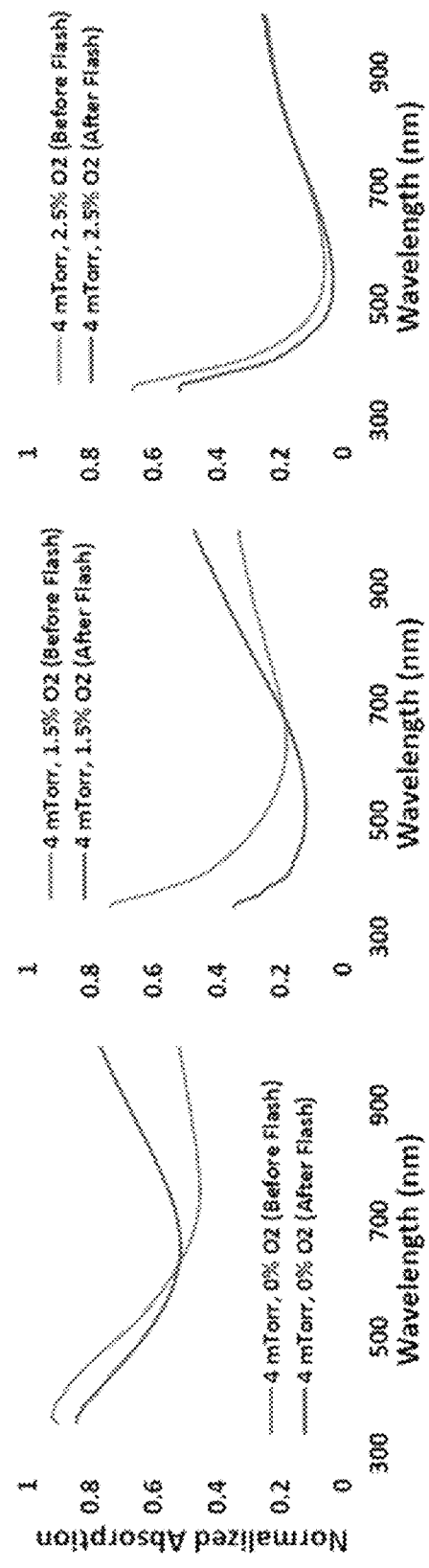
Fig. 11A
Fig. 11B

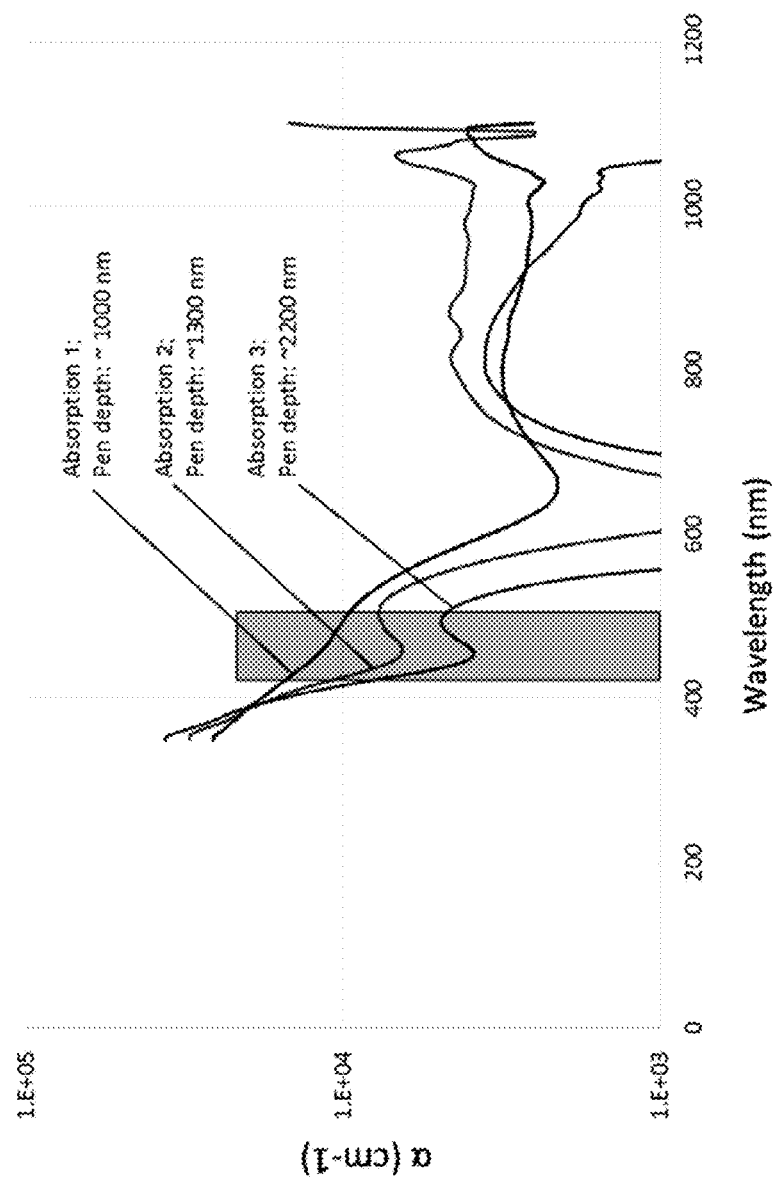

| Sample | Voltage (V) | Duration (μs) | Rs Before Flash (Ω) | Rs After Flash (Ω) |
|---|---|---|---|---|
| SG460 1kW-1 | 650 | 500 | 3.59 | 3.44 |
| 1kW-2 | 700 | 500 | 3.56 | 4-6 DAM |
| 1kW-3 | 675 | 500 | 3.59 | 3.64 DAM |
| 1kW-4 | 660 | 500 | 3.59 | 3.57 |
| 1kW-5 | 640 | 500 | 3.59 | 3.45 |
| 1kW-6 | 620 | 1000 | 3.58 | 3.85 |
| 1kW-7 | 600 | 1000 | 3.6 | 3.59 DAM |
| 1kW-8 | 580 | 1000 | 3.6 | 3.44 |
| 1kW-9 | 520 | 2000 | 3.57 | 3.43 |
| 1.5kW-1 | 650 | 500 | 3.59 | 3.36-3.8 DAM |
| 1.5kW-2 | 640 | 500 | 3.57 | 3.41 |
| 1.5kW-3 | 630 | 500 | 3.59 | 3.37 |
| 1.5kW-4 | 570 | 1000 |  | 3.37 |
| 1.5kW-5 | 500 | 2000 | 3.58 | 3.43 |
| 1.5kW-6 | 510 | 2000 | 3.58 | 3.42 |
| 1.5kW-7 | 520 | 2000 | 3.58 | 3.41 |
| 1.5kW-8 | 540 | 2000 | 3.58 | 3.4 |
| 1.5kW-4x4 | 640 | 500 |  |  |
| 2kW-1 | 640 | 500 | 3.63 | 3.39 |
| 2kW-2 | 630 | 500 | 3.63 | 3.42 |
| 2kW-3 | 650 | 500 | 3.63 | 3.42 |
| 2kW-4 | 580 | 1000 | 3.63 | 3.59 |
| 2kW-5 | 510 | 2000 |  | 3.45 |
| 2kW-6 | 700 | 400 | 3.63 | 3.60 DAM? |
| 2kW-7 | 690 | 400 | 3.65 | 3.47 |
| 2kW-8 | 680 | 400 |  | 3.41 |
| 2kW-9 | 670 | 400 |  | 3.4 |
| 2kW-10 | 710 | 300 | 3.63 | 3.43 |
| 2kW-11 | 720 | 300 | 3.63 | 3.4 |
| 2kW-12 | 730 | 300 | 3.63 | 3.53 |
| Nom-1 | 650 | 500 | 3.68 | 3.88 |
| Nom-2 | 630 | 500 | 3.68 | 3.62 |
| Nom-3 | 630 | 500 | 3.68 | 3.63 |
| Nom-4 | 600 | 500 | 3.67 | 3.56 |
| Nom-5 | 620 | 500 | 3.7 | 3.55 |
| Nom-4x4 |  |  | 3.65 |  |

*Fig. 15*

| Glass 2 | Visible | | | Color | | | | | |
|---|---|---|---|---|---|---|---|---|---|
| | | | | Transmitted | | | Reflected Exterior | | |
| | Trans | Refl. Ext | Refl. Int. | L* | a* | b* | L* | a* | b* |
| Sungate 460 - Standard | 74.2% | 12.4% | 11.0% | 89.02 | -2.18 | 1.20 | 41.92 | -1.94 | -0.03 |
| Sungate 460VT | 75.3% | 12.9% | 11.4% | 89.51 | -1.31 | 0.78 | 42.59 | -2.61 | 0.35 |
| 1.5_KV_-_4X4 | 76.0% | 12.9% | 11.7% | 89.85 | -1.50 | 1.46 | 42.64 | -1.78 | -0.37 |
| 1.5_KV_-_BF | 75.3% | 13.0% | 11.7% | 89.50 | -1.78 | 1.36 | 42.77 | -1.97 | -0.03 |
| NOM_-_4X4 | 75.3% | 13.0% | 11.6% | 89.53 | -1.59 | 1.33 | 42.70 | -2.35 | 0.32 |

*Fig. 16*

| Glass 2 | Solar | | | UV | Ufactor | | | | SC | SHGC | LSG | Emiss. |
|---|---|---|---|---|---|---|---|---|---|---|---|---|
| | | | | | Winter | | Summer | | | | | |
| | Trans | Refl. Ext | Refl. Int. | Trans | Btu/h-ft2-F | W/m2-K | Btu/h-ft2-F | W/m2-K | | | | |
| Sungate 460 - Standard | 43.7% | 28.4% | 26.1% | 17.5% | 0.302 | 1.713 | 0.286 | 1.623 | 0.648 | 0.564 | 1.32 | |
| Sungate 460VT | 46.4% | 27.5% | 29.2% | 20.4% | 0.296 | 1.679 | 0.277 | 1.575 | 0.665 | 0.579 | 1.30 | |
| 1.5_KV_-_4X4 | 47.5% | 27.8% | 30.7% | 17.8% | 0.300 | 1.705 | 0.284 | 1.613 | 0.664 | 0.578 | 1.32 | 0.053 |
| 1.5_KV_-_BF | 46.7% | 27.8% | 30.6% | 17.1% | 0.302 | 1.713 | 0.286 | 1.624 | 0.662 | 0.576 | 1.31 | 0.057 |
| NOM_-_4X4 | 47.1% | 27.6% | 30.6% | 17.5% | 0.302 | 1.717 | 0.287 | 1.629 | 0.666 | 0.579 | 1.30 | 0.059 |

*Fig. 17*

FLASH ANNEALING OF TRANSPARENT CONDUCTIVE OXIDE AND SEMICONDUCTOR COATINGS

FIELD OF THE INVENTION

Provided herein are methods of flash annealing coatings for articles including transparencies and optical devices.

TECHNICAL CONSIDERATIONS

Transparent conductive oxides (TCOs) are often used in production of architectural and automotive transparencies, as a dielectric layer, as well as in electro-optical devices, such as light-emitting diodes (LEDs), for example organic LEDs (OLEDs), and solar cells, such as photovoltaic thin film solar cells. LEDs and OLEDs are devices having an emissive layer that emits electromagnetic radiation, such as visible light, in response to the application of an electric current. The emissive layer is located between two electrodes (an anode and a cathode). When electric current is passed between the anode and the cathode (i.e., through the emissive layer), the emissive layer emits electromagnetic energy. OLEDs are used in numerous applications, such as television screens, computer monitors, mobile phones, personal digital assistants (PDAs), watches, lighting, and various other electronic devices. U.S. Pat. No. 9,627,652 describes OLED devices. Due to the versatility of TCOs in architectural, optical, and optoelectronics, having a method of rapidly and inexpensively producing unique physical, e.g., electrical and/or optical, attributes in a TCO or semiconductor layer is most desirable.

Solar control coatings are known in the fields of architectural and automotive transparencies. Those coatings block or filter selected ranges of electromagnetic radiation, such as in the range of solar infrared or solar ultraviolet radiation, to reduce the amount of solar energy entering the vehicle or building. This reduction of solar energy transmittance helps reduce the load on the cooling units of the vehicle or building. In automotive applications, the transparency (such as a windshield) is typically required to have a relatively high visible light transmittance, such as greater than 70 percent, to allow passengers to see out of the vehicle. For architectural applications, the visible light transmittance can be lower. In some architectural applications, it may be desirable to have a reflective outer surface so as to decrease visibility into the building to retain as much privacy as possible, while still allowing visible light to enter the building and also allowing the workers inside the building to see out.

As will be appreciated by one skilled in the architectural art, glass is used typically in either a tempered form or a non-tempered (annealed) form, depending upon the desired final use of the glass. For annealed glass, the glass is heated to the annealing point of the glass and then allowed to slowly cool to below the strain point of the glass. The annealed glass can be cut to desired final dimensions, such as for a door, window, and the like. For even stronger glass, tempering is used. In tempering, glass is heated above the annealing point of the glass and then rapidly cooled, such as by directing a cooling medium at the glass, to provide the glass with an exterior compressive force and an interior tensile force. Tempered glass is much stronger than annealed glass and is used where safety is an important factor. However, unlike annealed glass, tempered glass cannot be cut or it will shatter. Therefore, where tempered glass is desired, the glass must be cut to the desired final dimensions before tempering.

A conventional building may require both annealed (non-tempered) and tempered glass pieces with solar control coatings. For example, annealed glass with a solar control coating may be used on the lower floors while tempered glass with a solar control coating is used on the upper floors for increased safety. Both the coated annealed glass and the coated tempered glass should have the same or very similar optical characteristics so that the building maintains the same overall aesthetic appearance. This causes a problem for coated glass manufacturers. Tempering the coated glass pieces can result in the tempered products having different color or optical characteristics than the original annealed products due to changes in the coating caused by the extra heating and rapid cooling steps required to temper the glass. This difference in color or other optical properties, such as transmittance or reflectance, between the coated tempered glass and the coated annealed glass is not desirable if the annealed and tempered products are to be used in the same building.

Matching glass aesthetics is difficult. As a consequence, it would be desirable to have a method of treating coated glass sheets in a manner that alters aesthetics of the glass to match that of tempered glass sheets, permitting two types of glass to be used in the same building without significant differences in aesthetics between the two types of glass.

SUMMARY

According to one aspect of the invention, a method of producing a coated substrate comprising a layer comprising a transparent conductive oxide or a semiconductor is provided. The method comprises: depositing over at least a portion of a substrate in an inert atmosphere a transparent metal oxide or semiconductor layer having an absorption coefficient at a wavelength in the visible spectrum of at least 1,000 cm$^{-1}$; and flashing at least a portion of the transparent conductive oxide or semiconductor layer at a temperature ranging from 15° C. to 40° C., with a pulse ranging from 3.5 J/cm$^2$ to 6.0 J/cm$^2$, of non-coherent light within the visible spectrum including light the wavelength in the visible spectrum at which the layer has an absorption coefficient of at least 1,000 cm$^{-1}$.

According to another aspect of the invention, a transparent article is provided. The article comprises: a substrate; and a transparent conductive oxide or semiconductor-comprising layer over at least a portion of the substrate, comprising a first sub-layer having a first sheet resistance and a second sub-layer immediately over the first sub-layer having a second sheet resistance that is lower than the first sheet resistance.

BRIEF DESCRIPTION OF THE DRAWINGS

The invention will be described with reference to the following drawing figures wherein like reference numbers identify like parts throughout. Unless indicated otherwise, layers and element depicted in the drawing figures are not to scale and are depicted in a manner that facilitates description of the elements and the structure of the depicted items.

FIGS. 11A and 11B provide graphs showing optical properties of flash annealed ITO layers having differing amounts of oxygen. FIG. 11A shows transmission (%) spectra, and FIG. 11B shows normalized absorption spectra.

FIG. 13A shows the absorption coefficient spectrum for three samples of ITO-coated float glass where the ITO has different absorption spectra.

FIG. 15 provides a table of flash voltage conditions and sheet resistance measurements for Example 7.

FIG. 16 provides a table showing color and visible luminosity of a simulated insulated glass using coating properties as described in Example 7.

FIG. 17 provides selected center-of-glass performance characteristics of a simulated insulated glass using coating properties as described in Example 7.

DESCRIPTION OF THE PREFERRED EMBODIMENTS

Figure 1:
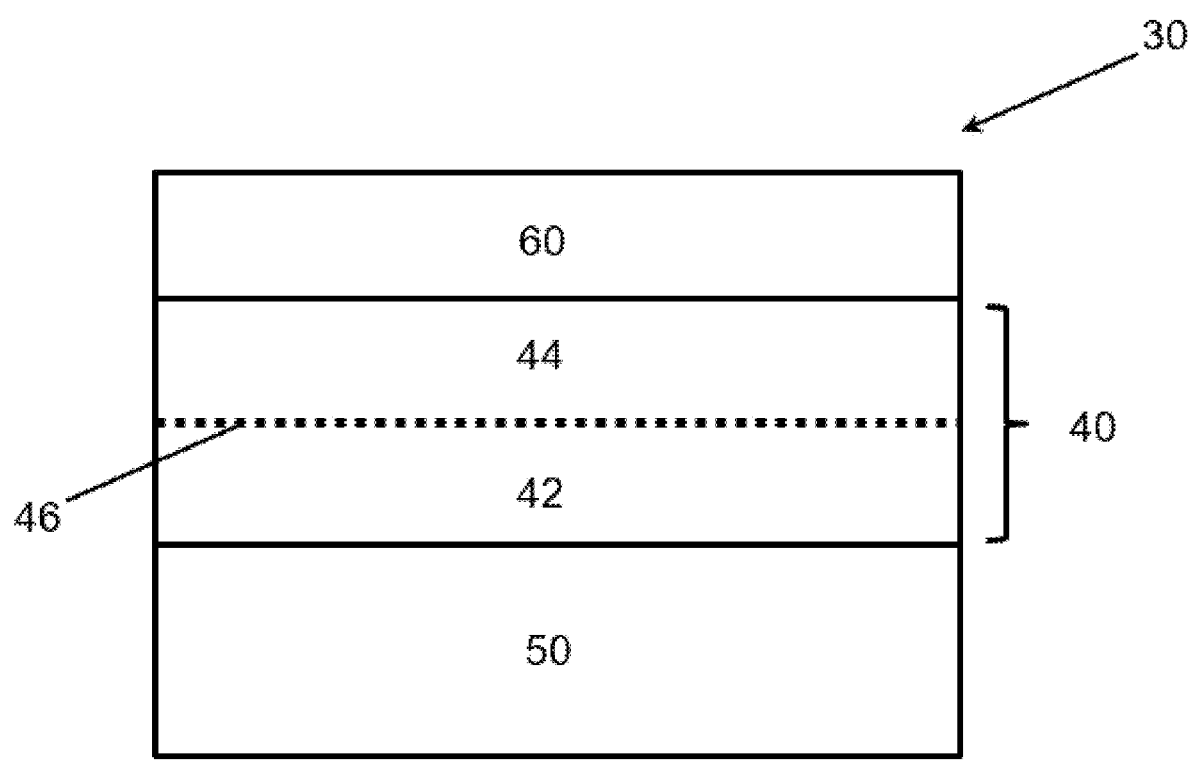
FIG. 1 depicts a cross section of an article comprising a substrate and a partially flash annealed layer over the substrate.

As used herein, spatial or directional terms, such as "left", "right", "inner", "outer", "above", "below", and the like, relate to the invention as it is shown in the drawing figures. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like. Additionally, all documents, such as, but not limited to, issued patents and patent applications, referred to herein are to be considered to be "incorporated by reference" in their entirety.

Further, as used herein, the terms "formed over", "deposited over", or "provided over" mean formed, deposited, or provided on but not necessarily in contact with the surface. For example, a coating layer "formed over" a substrate does not preclude the presence of one or more other coating layers or films of the same or different composition located between the formed coating layer and the substrate. Likewise, the terms "under" or "between" in the context of specified coating layers does not preclude the presence of one or more other coating layers or films of the same or different composition located between the recited layers.

As used herein, the terms "polymer" or "polymeric" include oligomers, homopolymers, copolymers, and terpolymers, e.g., polymers formed from two or more types of monomers or polymers, and a "plastic" is a polymer-containing material that optionally can contain additional additives to alter a property of the material.

The terms "visible region" or "visible light" refer to electromagnetic radiation having a wavelength in the range of 380 nm to 800 nm. The terms "infrared region" or "infrared radiation" refer to electromagnetic radiation having a wavelength in the range of greater than 800 nm to 100,000 nm. The terms "ultraviolet region" or "ultraviolet radiation" mean electromagnetic energy having a wavelength in the range of 300 nm to less than 380 nm. By "transparent" is meant having visible light transmission of greater than 0% up to 100%. By "translucent" is meant allowing electromagnetic energy (e.g., visible light) to pass through but diffusing this energy such that objects on the side opposite the viewer are not clearly visible. Although a typical "transparency" can have sufficient visible light transmission such that materials can be viewed through the transparency, a "transparency" need not be transparent to visible light but may be translucent or opaque.

As used herein, the term "film" refers to a coating region of a desired or selected coating composition. A "layer" can comprise one or more "films", and a "coating" or "coating stack" can comprise one or more "layers". The term "asymmetrical reflectivity" means that the visible light reflectance of the coating from one side is different than that of the coating from the opposite side. The term "critical thickness" means a thickness above which a coating material forms a continuous, uninterrupted layer and below which the coating material forms discontinuous regions or islands of the coating material rather than a continuous layer. The term "sub-critical thickness" means a thickness below the critical thickness such that the coating material forms isolated, non-connected regions of the coating material. The term "islanded" means that the coating material is not a continuous layer but, rather, that the material is deposited to form isolated regions or islands.

Provided herein are methods of improving one or more physical attributes of a coated article or a coating layer of a coated article, as are found in coated objects or transparencies, such as are found in architectural glass, vehicle transparencies, light-emitting diodes (LEDs), organic LEDs, photovoltaic cells, electro-optic devices, etc. In aspects, the described coated articles are useful in bottom-emitting or top-emitting LED or OLED devices, solar cells, such as photovoltaic thin film solar cells. For example, an LED or OLED may use at least one transparent conductive oxide as an electrode, through which light passes and is extracted from the emissive layer. TCOs for use as an electrode for an LED device should have low sheet resistance. It is to be understood that the methods and articles described herein are not limited to such uses. Therefore, it is to be understood that the specifically disclosed exemplary embodiments are presented simply to explain the general concepts of the invention, and that the invention is not limited to these specific examples.

Flash annealing is a process by which an article comprising at least one layer over a substrate is flashed with one or more pulses of visible light, resulting in a physical transformation of the one or more layers by the flash of visible light. Any source of visible light that can produce a flash of sufficient luminous flux (energy time$^{-1}$) to flash anneal an article within the context of the present disclosure may be used in the methods described herein. The methods may utilize a broad spectrum flash, such as a xenon lamp flash, ranging from 1-10.0 J/cm$^2$, and increments therebetween, for example from 3.5-6.0 J/cm$^2$, and preferably from 4.0 to 5.0 J/cm$^2$. in aspects, the pulse length ranges from 0.1 ms to 10 ms, and increments therebetween, from 0.2 ms to 2 ms, and increments therebetween, for example from 250 µs to 1 ms, 500 µs, 650 µs, 670 µs. Excessive flash energy will damage the targeted layer. Lamps useful for generating flashes include gaseous discharge lamps, such as helium or xenon lamps, and metal vapor lamps, such as mercury vapor lamp. Multi-vapor discharge lamps may be used to achieve a more uniform spectral distribution. In one aspect, the lamp is a xenon discharge flash lamp. In various aspects of the invention, a single flash is capable of sufficiently modifying one or more physical qualities of a layer. A "single flash pulse" includes: exposure of the transparency or a portion thereof to one pulse; two or more pulses flashing different portions of the transparency, or two or more overlapping pulses where each pulse of the overlapping pulses flashes a different area or portion of the transparency, but the two portions flash one or more overlapping points on the surface of the transparency.

The articles described herein are coated and otherwise processed by conventional methods and systems, e.g., by an in-line magnetron sputter deposition system. Articles can be conveyed into and from various deposition systems or treatment stations by conventional conveying methods and systems. Flashing of the articles can be performed at room temperature, typically in the range of from 20° C. to 30° C., such as at 22° C. or 25° C., though flashing can be performed at temperatures outside this range, such as from 15° C. to 50° C. In aspects, one or more flashtubes are placed in position over a conveyor and at a suitable distance from the conveyor for flashing the article at a desirable intensity. A conveyor system moves the article relative to the flashtube(s), and timing of conveyor movement can be coordinated, e.g., by computer control, with flashing of the article such that one or more flashes are applied to any given position on the article. For larger articles, multiple flashes can be used to flash all positions on the surface of the article, and the flashes may overlap or abut each-other so that the surface of the article is flashed with a sufficient amount of light to transform one or more physical attributes of the article, as described herein, such as, without limitation: sheet resistance, emissivity, conductance, color, or transmittance.

In the methods and articles described herein, a substrate is coated with at least on layer that is flash annealed. Exemplary substrates include transparent or opaque substrates, such as substrates comprising, without limitation, glass, plastic, crystal, metal, ceramic, or combinations thereof. Non-limiting examples of glass that can be used as a substrate include clear glass, Starphire®, Solargreen®, Solextra®, GL-20®, GL-35™, Solarbronze®, Solargray® glass, Pacifica® glass, SolarBlue® glass, Solarphire® glass, Solarphire PV® glass, and Optiblue® glass, all commercially available from PPG Industries Inc. of Pittsburgh, Pennsylvania. For example, glasses can include conventional soda-lime-silicate glass, borosilicate glass, or leaded glass. The glass can be clear glass. By "clear glass" is meant non-tinted or non-colored glass. Alternatively, the glass can be tinted or otherwise colored glass. The glass can be annealed or heat-treated glass. As used herein, the term "heat treated" means tempered or at least partially tempered. The glass can be of any type, such as conventional float glass, and can be of any composition having any optical properties, e.g., any value of visible transmission, ultraviolet transmission, infrared transmission, and/or total solar energy transmission. By "float glass" is meant glass formed by a conventional float process in which molten glass is deposited onto a molten metal bath and controllably cooled to form a float glass ribbon. Examples of float glass processes are disclosed in U.S. Pat. Nos. 4,466,562 and 4,671,155. As used herein, the term "solar control coating" refers to a coating comprised of one or more layers or films that affect the solar properties of the coated article, such as, but not limited to, the amount of solar radiation, for example, visible, infrared, or ultraviolet radiation, reflected from, absorbed by, or passing through the coated article; shading coefficient; emissivity; etc.

Examples of additional suitable substrate materials include, but are not limited to, plastic substrates, such as acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalates, and the like; polysiloxane-containing polymers; or copolymers of any monomers for preparing these, or any mixtures thereof; ceramic substrates; glass substrates; or mixtures or combinations of any of the above.

Layers applied over the substrate often comprise metals, oxides, semiconductors, and dielectrics, including transparent metals, metal oxides, conductive oxides, semiconductors, and dielectrics. Physical properties or physical attributes include: transmittance; absorption; color; emissivity; sheet resistance; conductance, e.g., carrier concentration or carrier mobility; crystallinity or crystal structure; refraction coefficient; or surface plasmon resonance, among other effects, alone or in combination. Additional layers can include protective or overcoat layers, such as silica or aluminum silica layers as are broadly-known, for example as further described below in the context of various aspects of the disclosure.

Coating layers as described herein can be deposited by any conventional method, such as, but not limited to, conventional chemical vapor deposition (CVD) and/or physical vapor deposition (PVD) methods. Examples of PVD processes include thermal or electron beam evaporation and vacuum sputtering (such as magnetron sputter vapor deposition (MSVD)). Other coating methods could also be used, such as, but not limited to, sol-gel deposition. In one aspect, the coating can be deposited by MSVD. Examples of MSVD coating devices and methods will be well understood by one of ordinary skill in the art and are described, for example, in U.S. Pat. Nos. 4,379,040; 4,861,669; 4,898,789; 4,898,790; 4,900,633; 4,920,006; 4,938,857; 5,328,768; and 5,492,750.

According to one aspect, a method of producing a coated substrate comprising a layer of a transparent conductive oxide or a semiconductor is provided. Non-limiting examples of transparent conductive oxides include: oxides of titanium, hafnium, zirconium, niobium, zinc, bismuth, lead, indium, tin, and mixtures thereof, and may be doped with other elements, such as gallium or aluminum. Specific examples of transparent conductive oxides include, without limitation: indium tin oxide, indium zinc oxide, fluorinated tin oxide ("FTO"), a doped zinc oxide, such as gallium-, aluminum-, or tin-doped zinc oxide ("GZO", "AZO" and "TZO", respectively), or a doped titanium dioxide, such as niobium-doped $TiO_2$ ("NTO"). Suitable transparent conductive oxides include oxygen-deficient transparent conductive oxides. By "oxygen-deficient transparent conductive oxide", it is meant that the conductive oxide is deposited under conditions, such as by sputtering, e.g. by MSVD, in an inert atmosphere, such as an argon atmosphere with a subsaturation amount of oxygen, yielding the oxygen-deficient, or sub-stoichiometric TCO. Oxygen-deficient TCOs, such as oxygen-deficient ITO, are broadly-known and are readily made by those of ordinary skill in the art. As used herein a recited percent of oxygen in a sputtering atmosphere refers to volume percent. Non-limiting examples of semiconductors that may be flash annealed according to the methods described herein include: as an example the flash annealing of amorphous silicon layers to produce polycrystalline Silicon and germanium films.

The method further comprises depositing over at least a portion of a substrate in an inert atmosphere a transparent metal oxide or semiconductor layer having an absorption coefficient at a wavelength in the visible spectrum of at least $1,000$ $cm^{-1}$; and flashing at least a portion of the transparent conductive oxide or semiconductor layer at a temperature ranging from 15° C. to 50° C., or ranging from 20° C. to 30° C., with a pulse energy ranging from 3.5 $J/cm^2$ to 6.0 $J/cm^2$, of non-coherent light within the visible spectrum that includes light the wavelength in the visible spectrum at which the layer has an absorption coefficient of at least 1,000 $cm^{-1}$. In one aspect, the pulse is a single pulse, which is sufficient to, e.g., substantially decrease sheet resistance, increase conductance, decrease emissivity, and increase transmittance of the layer and the article as a whole. In one aspect, the transparent metal oxide or semiconductor layer is a transparent conductive oxide layer, and in one aspect is an indium tin oxide layer, or an oxygen-deficient indium tin oxide layer having a thickness ranging from 200 to 400 nm, or 200 to 300 nm, for example 250 nm.

One feature of transparent conductive oxides, such as ITO, and semiconductors that find use as coatings, e.g. on transparent substrates is that they have an absorption coefficient that can be optimized or modified. For example, oxygen-deficient transparent conductive oxides, such as oxygen-deficient indium tin oxide as an example, has a sufficiently large absorption coefficient at certain wavelengths such that light at those wavelengths cannot fully penetrate the complete thickness of a layer of that material to permit flash annealing through the entire thickness of the layer. Thus, sufficient matching of absorption coefficient and thickness of a layer with lamp discharge spectrum and intensity such that the penetration depth of the light produced by the lamp that is capable of flash annealing the layer does not fully penetrate the full thickness of the layer will result in a split or bifurcated layer with different physical attributes of the flashed portion of the layer as compared to the un-flashed portion of the layer to which light did not penetrate to a sufficient extent. A suitable thickness for an indium tin oxide layer or an oxygen-deficient indium tin oxide layer at which the penetration depth of a Xenon lamp pulse is less than the thickness of the layer is greater than 300 nm, for example ranging from 300 nm to 2 μm (microns) in thickness.

Referring to FIG. 1, and in the context of a transparent article 30, a first layer 40 comprising a transparent conductive oxide or semiconductor is deposited over a substrate 50. When flashed as described herein, the first layer 40 is split into a first sub-layer 42 and a second sub-layer 44 joined at a transition 46. The first sub layer 42 of a transparent conductive oxide or semiconductor has a first physical state, for example and without limitation having a first sheet resistance, conductance, color, or transmittance, and the second sub-layer 44 is converted by a light flash to a second physical state, for example and without limitation having a second sheet resistance, conductance, color, or transmittance. The first and second sub-layers 42 and 44 can therefore be considered a single, integrated layer that includes the bottom sub-layer (distal to the flash) that remains in an unflashed state, and a top sub-layer immediately over the first sub-layer that is converted by the light flash. By the nature of the flashing, the top and bottom sub-layers may be joined at the transition 46 of unspecified thickness that has physical characteristics that may be different from the first and/or second sub-layers, for example, intermediate to the first and second sublayers. An optional protective layer 60 is depicted. Additional layers may be included over or between depicted layers.

Traditional heating methods are incapable of forming a split transparent conductive oxide or semiconductor layer as is produced by the flash methods described herein. Use of conductive heat requires raising the temperature of the transparent conductive oxide or semiconductor layer to a temperature exceeding 400° C., and for thin layers, e.g. with thicknesses of less than 5 μm, and especially submicron thicknesses, such as in the range of the TCO layers described herein, the surface heat of the layer conducts through the entire layer essentially immediately, resulting in a uniform transformation of the layer throughout its thickness. Therefore, by flashing a layer having an appropriately high coefficient of absorption such that the light does not penetrate through the entire thickness of the layer, only the portion of the layer that the light penetrates will be transformed, leaving an untransformed layer. Such a configuration is useful to control, e.g., color, transmittance, light scattering, light trapping, sheet resistance, reflectance, refraction, conductance, or other relevant physical parameters of a coated article.

According to another aspect of the disclosure, a method of flash annealing transparencies comprising metallic reflective layers is provided. In one aspect, the method permits effective annealing of transparencies comprising two or more metal, e.g. silver, layers. The flash annealing facilitates close color matching of annealed products with tempered products, decreased sheet resistance, increased transmittance, production of desirable color profiles, and a general increase in the quality of the product.

Figure 2:
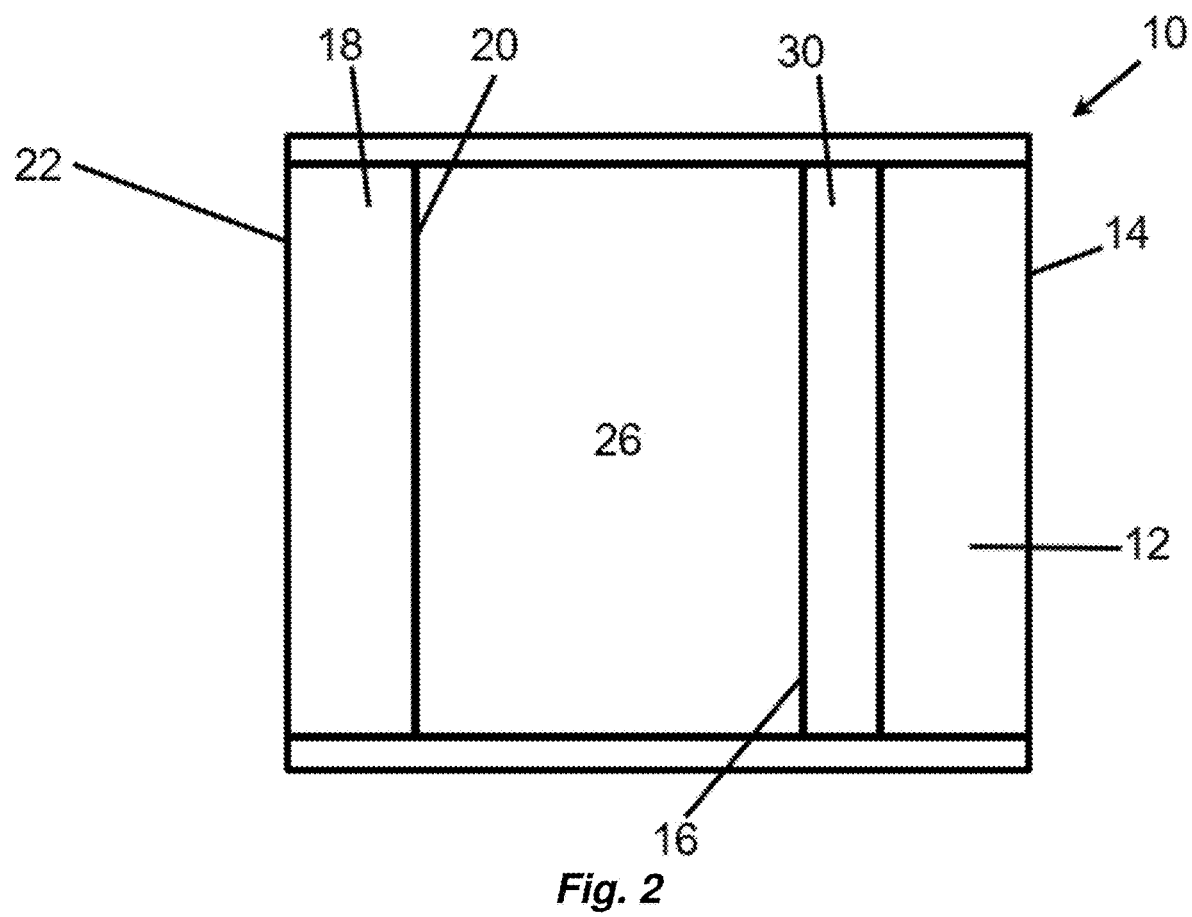
FIG. 2 depicts a portion of an insulating glass unit.

According to various aspects, coatings produced by the flash annealing method described herein may be used in an architectural transparency. As an example, a non-limiting example of a transparency 10 incorporating a third surface coating, such as a coating comprising two or more silver layers is illustrated in FIG. 2. The transparency 10 can have any desired visible light, infrared radiation, or ultraviolet radiation transmission and/or reflection. For example, the transparency 10 can have a visible light transmittance of any desired amount, e.g., greater than 0% up to 100%.

The exemplary transparency 10 of FIG. 2 is in the form of a conventional insulating glass unit and includes a first ply 12 with a first major surface 14 (No. 1 surface) and an opposed second major surface 16 (No. 2 surface). In the illustrated non-limiting aspect, the first major surface 14 faces the building exterior, i.e., is an outer major surface, and the second major surface 16 faces the interior of the building. The transparency 10 also includes a second ply 18 having an outer (first) major surface 20 (No. 3 surface) and an inner (second) major surface 22 (No. 4 surface) and spaced from the first ply 12. This numbering of the ply surfaces is in keeping with conventional practice in the fenestration art. The first and second plies 12, 18 can be connected together in any suitable manner, such as by being adhesively bonded to a conventional spacer frame 24. A gap or chamber 26 is formed between the two plies 12, 18. The chamber 26 can be filled with a selected atmosphere, such as air, or a non-reactive gas such as argon or krypton gas. A solar control coating 30 (or any of the other coatings described herein) is formed over at least a portion of one of the plies 12, 18, such as, but not limited to, over at least a portion of the No. 2 surface 16 or at least a portion of the No. 3 surface 20. Although, the coating could also be on the No. 1 surface or the No. 4 surface, if desired. Examples of insulating glass units are found, for example, in U.S. Pat. Nos. 4,193,236; 4,464,874; 5,088,258; and 5,106,663.

The plies 12, 18 of the transparency 10 can be of the same or different materials. The plies 12, 18 can include any desired material having any desired characteristics. For example, one or more of the plies 12, 18 can be transparent or translucent to visible light. Examples of suitable materials include, but are not limited to, plastic substrates (such as acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalates, and the like; polysiloxane-containing polymers; or copolymers of any monomers for preparing these, or any mixtures thereof); ceramic substrates; glass substrates; or mixtures or combinations thereof. For example, one or more of the plies 12, 18 can include conventional soda-lime-silicate glass, borosilicate glass, or leaded glass. The glass can be clear glass. By "clear glass" is meant non-tinted or non-colored glass. Alternatively, the glass can be tinted or otherwise colored glass. The glass can be annealed or heat-treated glass. The glass can be of any type, such as conventional float glass, and can be of any composition having any optical properties, e.g., any value of visible transmission, ultraviolet transmission, infrared transmission, and/or total solar energy transmission.

The first and second plies 12, 18 can each be, for example, clear float glass or can be tinted or colored glass or one ply 12, 18 can be clear glass and the other ply 12, 18 colored glass. Although not limiting to the invention, examples of glass suitable for the first ply 12 and/or second ply 18 are described in U.S. Pat. Nos. 4,746,347; 4,792,536; 5,030, 593; 5,030,594; 5,240,886; 5,385,872; and 5,393,593. The first and second plies 12, 18 can be of any desired dimensions, e.g., length, width, shape, or thickness. In one exemplary automotive transparency, the first and second plies can each be 1 mm to 10 mm thick, such as 1 mm to 8 mm thick, such as 2 mm to 8 mm, such as 3 mm to 7 mm, such as 5 mm to 7 mm, such as 6 mm thick. Non-limiting examples of glass that can be used are described above.

In one aspect, a solar control coating 30 is deposited over at least a portion of at least one major surface of one of the glass plies 12, 18. In the example shown in FIG. 2, the coating 30 is formed over at least a portion of the inner surface 16 of the outboard glass ply 12. The solar control coating 30 can block, absorb, or filter selected portions of the solar spectrum, such as, but not limited to, the IR, UV, and/or visible spectrums.

The solar control coating 30 can be deposited by any conventional method, such as, but not limited to, conventional chemical vapor deposition (CVD) and/or physical vapor deposition (PVD) methods. Examples of CVD processes include spray pyrolysis. Examples of PVD processes include electron beam evaporation and vacuum sputtering (such as magnetron sputter vapor deposition (MSVD)). Other coating methods could also be used, such as, but not limited to, sol-gel deposition. In one non-limiting embodiment, the coating 30 can be deposited by MSVD. Examples of MSVD coating devices and methods will be well understood by one of ordinary skill in the art and are described, for example, in U.S. Pat. Nos. 4,379,040; 4,861,669; 4,898, 789; 4,898,790; 4,900,633; 4,920,006; 4,938,857; 5,328, 768; and 5,492,750.

U.S. Pat. No. 9,604,875 describes transparencies incorporating subcritical metallic layers, such as a transparency incorporating two continuous silver layers and a subcritical silver layer. Commercial products including tempered and non-tempered versions of the article described below, with tempered product (e.g., SOLARBAN® 90 VT) requiring thicker primer layers, as compared to primer layer thickness of the non-tempered product (e.g., SOLARBAN® 90) and, with the exception of the subcritical (discontinuous) silver layer, which cannot be increased in thickness without changing its unique optical properties, thickness of one or more continuous silver layers can be increased and thicknesses of one or more primer layers is increased in the tempered product as compared to the non-tempered product. In one aspect, thickness of one or more of the flash annealed primer layers is between the thickness of the non-tempered product and the tempered product, for example where one or more primer layers has a thickness ranging from the thickness of a primer layer in the non-tempered product plus 20% to 80% of the thickness difference between the primer layer thicknesses of the tempered product minus the primer layer thicknesses of the non-tempered products.

Figure 3:
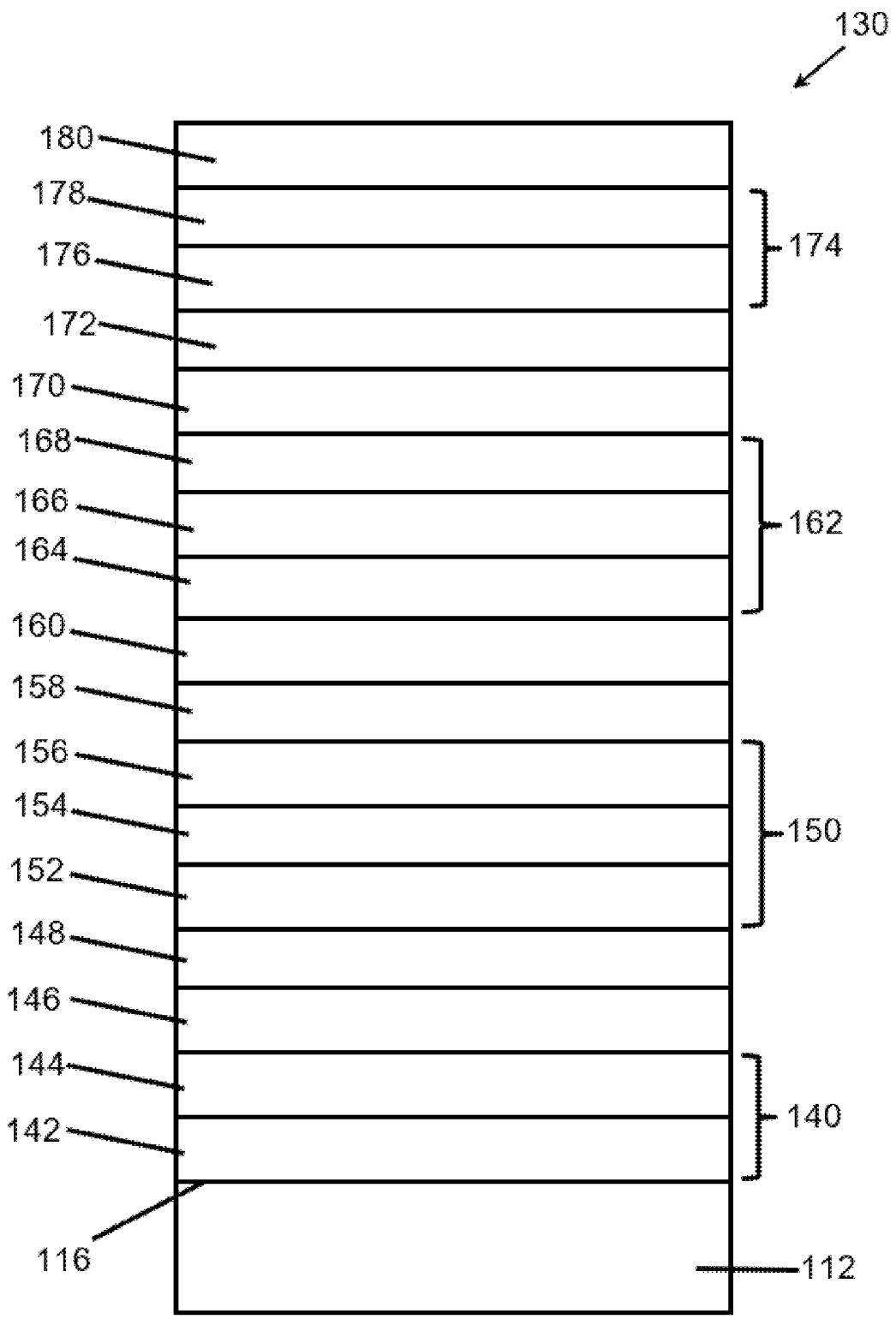
FIG. 3 depicts a coated transparency comprising a discontinuous metal layer.

An exemplary non-limiting solar control coating 130 having a subcritical metallic layer is shown in FIG. 3. This exemplary coating 130 includes a base layer or first dielectric layer 40 deposited over at least a portion of a major surface of a substrate (e.g., the No. 2 surface 116 of the first ply 112). The first dielectric layer 140 can be a single layer or can comprise more than one film of antireflective materials and/or dielectric materials, such as, but not limited to, metal oxides, oxides of metal alloys, nitrides, oxynitrides, or mixtures thereof. The first dielectric layer 140 can be transparent to visible light. Examples of suitable metal oxides for the first dielectric layer 140 include oxides of titanium, hafnium, zirconium, niobium, zinc, bismuth, lead, indium, tin, and mixtures thereof. These metal oxides can have small amounts of other materials, such as manganese in bismuth oxide, tin in indium oxide, etc. Additionally, oxides of metal alloys or metal mixtures can be used, such as oxides containing zinc and tin (e.g., zinc stannate, defined below), oxides of indium-tin alloys, silicon nitrides, silicon aluminum nitrides, or aluminum nitrides. Further, doped metal oxides, such as antimony, or indium doped tin oxides or nickel or boron doped silicon oxides, can be used. The first dielectric layer 140 can be a substantially single phase film, such as a metal alloy oxide film, e.g., zinc stannate, or can be a mixture of phases composed of zinc and tin oxides or can be composed of a plurality of films.

For example, the first dielectric layer 140 (whether a single film or multiple film layer) can have a thickness in the range of 100 Å to 600 Å, such as 200 Å to 500 Å, such as 250 Å to 350 Å, such as 250 Å to 310 Å, such as 280 Å to 310 Å, such as 300 Å to 330 Å, such as 310 Å to 330 Å.

The first dielectric layer 140 can comprise a multi-film structure having a first film 142, e.g., a metal alloy oxide film, deposited over at least a portion of a substrate (such as the inner major surface 116 of the first ply 112) and a second film 144, e.g., a metal oxide or oxide mixture film, deposited over the first metal alloy oxide film 142. In one non-limiting embodiment, the first film 142 can be a zinc/tin alloy oxide. By "zinc/tin alloy oxide" is meant both true alloys and also mixtures of the oxides. The zinc/tin alloy oxide can be that obtained from magnetron sputtering vacuum deposition from a cathode of zinc and tin. One non-limiting cathode can comprise zinc and tin in proportions of 5 wt. % to 95 wt. % zinc and 95 wt. % to 5 wt. % tin, such as 10 wt. % to 90 wt. % zinc and 90 wt. % to 10 wt. % tin. However, other ratios of zinc to tin could also be used. One suitable metal alloy oxide that can be present in the first film 142 is zinc stannate. By "zinc stannate" is meant a composition of $Zn_xSn_{1-x}O_{2-x}$ (Formula 1) where "x" varies in the range of greater than 0 to less than 1. For instance, "x" can be greater than 0 and can be any fraction or decimal between greater than 0 to less than 1. For example, where x=⅔, Formula 1 is $Zn_{2/3}Sn_{1/3}O_{4/3}$, which is more commonly described as "$Zn_2SnO_4$". A zinc stannate-containing film has one or more of the forms of Formula 1 in a predominant amount in the film.

The second film 144 can be a metal oxide film, such as zinc oxide. The zinc oxide film can be deposited from a zinc cathode that includes other materials to improve the sputtering characteristics of the cathode. For example, the zinc cathode can include a small amount (e.g., up to 10 wt. %, such as up to 5 wt. %) of tin to improve sputtering. In which case, the resultant zinc oxide film would include a small percentage of tin oxide, e.g., up to 10 wt. % tin oxide, e.g., up to 5 wt. % tin oxide. A coating layer deposited from a zinc cathode having up to 10 wt. % tin (added to enhance the conductivity of the cathode) is referred to herein as "a zinc oxide film" even though a small amount of tin may be present. The small amount of tin in the cathode (e.g., less than or equal to 10 wt. %, such as less than or equal to 5 wt. %) is believed to form tin oxide in the predominantly zinc oxide second film 144.

For example, the first film 142 can be zinc stannate and the second film 144 can be zinc oxide (for example, 90 wt. % zinc oxide and 10 wt. % tin oxide). For example, the first film 142 can comprise zinc stannate having a thickness in the range of 50 Å to 600 Å, such as 50 Å to 500 Å, such as 75 Å to 350 Å, such as 100 Å to 250 Å, such as 150 Å to 250 Å, such as 195 Å to 250 Å, such as 200 Å to 250 Å, such as 200 Å to 220 Å.

The second film 144 can comprise zinc oxide having a thickness in the range of 50 Å to 200 Å, such as 75 Å to 200 Å, such as 100 Å to 150 Å, such as 100 Å to 110 Å.

A first heat and/or radiation reflective metallic layer 146 can be deposited over the first dielectric layer 140. The first reflective layer 146 can include a reflective metal, such as, but not limited to, metallic gold, copper, palladium, aluminum, silver, or mixtures, alloys, or combinations thereof. In one embodiment, the first reflective layer 146 comprises a metallic silver layer having a thickness in the range of 50 Å to 300 Å, e.g., 50 Å to 250 Å, e.g., 50 Å to 200 Å, such as 70 Å to 200 Å, such as 100 Å to 200 Å, such as 125 Å to 200 Å, such as 150 Å to 185 Å. The first metallic layer 146 is a continuous layer. By "continuous layer" is meant that the coating forms a continuous film of the material and not isolated coating regions.

A first primer layer 148 is located over the first reflective layer 146. The first primer layer 148 can be a single film or a multiple film layer. The first primer layer 148 can include an oxygen-capturing material that can be sacrificial during the deposition process to prevent degradation or oxidation of the first reflective layer 146 during the sputtering process or subsequent heating processes. The first primer layer 148 can also absorb at least a portion of electromagnetic radiation, such as visible light, passing through the coating 130. Examples of materials useful for the first primer layer 148 include titanium, silicon, silicon dioxide, silicon nitride, silicon oxynitride, nickel-chrome alloys (such as Inconel), zirconium, aluminum, alloys of silicon and aluminum, alloys containing cobalt and chromium (e.g., Stellite®), and mixtures thereof. For example, the first primer layer 148 can be titanium and can have a thickness in the range of 5 Å to 50 Å, e.g., 10 Å to 40 Å, e.g., 20 Å to 40 Å, e.g., 20 Å to 35 Å.

A second dielectric layer 150 is located over the first reflective layer 146 (e.g., over the first primer layer 148). The second dielectric layer 150 can comprise one or more metal oxide or metal alloy oxide-containing films, such as those described above with respect to the first dielectric layer 140. For example, the second dielectric layer 150 can include a first metal oxide film 152, e.g., a zinc oxide film, deposited over the first primer film 148 and a second metal alloy oxide film 154, e.g., a zinc stannate ($Zn_2SnO_4$) film, deposited over the first zinc oxide film 152. An optional third metal oxide film 156, e.g., another zinc oxide layer, can be deposited over the zinc stannate layer.

The second dielectric layer 150 can have a total thickness (e.g., the combined thicknesses of the layers) is in the range of 50 Å to 1000 Å, e.g., 50 Å to 500 Å, e.g., 100 Å to 370 Å, e.g., 100 Å to 300 Å, e.g., 100 Å to 200 Å, e.g., 150 Å to 200 Å, e.g., 180 Å to 190 Å.

For example, for a multi-film layer, the zinc oxide film 152 (and optional second zinc oxide film 156, if present) can have a thickness in the range of 10 Å to 200 Å, e.g., 50 Å to 200 Å, e.g., 60 Å to 150 Å, e.g., 70 Å to 85 Å. The metal alloy oxide layer (zinc stannate) 54 can have a thickness in the range of 50 Å to 800 Å, e.g., 50 Å to 500 Å, e.g., 100 Å to 300 Å, e.g., 110 Å to 235 Å, e.g., 110 Å to 120 Å.

A subcritical thickness (discontinuous) second metallic layer 158 is located over the second dielectric layer 150 (e.g., over the second zinc oxide film 156, if present, or over the zinc stannate film 154 if not). The metallic material, such as, but not limited to, metallic gold, copper, palladium, aluminum, silver, or mixtures, alloys, or combinations thereof, is applied at a subcritical thickness such that isolated regions or islands of the material are formed rather than a continuous layer of the material. For silver, it has been determined that the critical thickness is less than 50 Å, such as less than 40 Å, such as less than 30 Å, such as less than 25 Å. For silver, the transition between a continuous layer and a subcritical layer occurs in the range of 25 Å to 50 Å. It is estimated that copper, gold, and palladium would exhibit similar subcritical behavior in this range. The second metallic layer 158 can include any one or more of the materials described above with respect to the first reflective layer 146 but these materials are not present as a continuous film. In one non-limiting embodiment, the second layer 158 comprises islanded silver with the islands having an effective thickness in the range of 1 Å to 70 Å, e.g., 10 Å to 40 Å, e.g., 10 Å to 35 Å, e.g., 10 Å to 30 Å, e.g., 15 Å to 30 Å, e.g., 20 Å to 30 Å, e.g., 25 Å to 30 Å. The subcritical metallic layer 158 absorbs electromagnetic radiation according to the Plasmon Resonance Theory. This absorption depends at least partly on the boundary conditions at the interface of the metallic islands. The subcritical metallic layer 158 is not an infrared reflecting layer, like the first metallic layer 146. The subcritical silver layer 158 is not a continuous layer. It is estimated that for silver, the metallic islands or balls of silver metal deposited below the subcritical thickness can have a height of about 2 nm to 7 nm, such as 5 nm to 7 nm. It is estimated that if the subcritical silver layer could be spread out uniformly, it would have a thickness of about 1.1 nm. It is estimated that optically, the discontinuous metal layer behaves as an effective layer thickness of 2.6 nm. Depositing the discontinuous metallic layer over zinc stannate rather than zinc oxide appears to increase the visible light absorbance of the coating, e.g., of the discontinuous metallic layer.

The thickness values associated with the "subcritical" layers are an "effective thickness". The effective thickness can be calculated based on a reference coating speed that is slower than the actual coating speed of the commercial coater. For example, a silver layer is applied onto a substrate at the same coating rate as a commercial coater but at a reduced line speed (reference coating speed) compared to the commercial coater. The thickness of the coating deposited at the reference coating speed is measured and then the "effective thickness" for a coating deposited at the same coating rate but at the faster line speed of the commercial costar is extrapolated. For example, if a particular coating rate provides a silver coating of 25 nm at reference coating speed that is one-tenth the line speed of the commercial coater, then the "effective thickness" of the silver layer at the same coating rate but at the commercial costar line speed (i.e., ten time faster than the reference coating run) is extrapolated to be 2.5 nm (i.e., one tenth the thickness). However, as will be appreciated, the silver layer at this effective thickness (below the subcritical thickness) would not be a continuous layer but rather would be a discontinuous layer having discontinuous regions of silver material. Another way to adjust the thickness of the subcritical silver layer is to decrease the power applied to the cathode depositing that layer. For example, the coater could be set up with power supplied to the cathodes to provide known coating thicknesses. The power to the cathode for the subcritical silver layer could then be reduced and the subcritical silver layer thickness extrapolated based on the reduced power level. Or, a series of samples could be generated at different power levels until a desired L*, a*, and b* is achieved A second primer layer 160 can be deposited over the second metallic layer 158. The second primer layer 160 can be as described above with respect to the first primer layer 148. In one example, the second primer layer can be titanium or a nickel-chromium alloy (such as Inconel) having a thickness in the range of 5 Å to 50 Å, e.g., 10 Å to 25 Å, e.g., 15 Å to 25 Å, e.g., 15 Å to 22 Å. Since the absorbance of the subcritical material depends at least partly on the boundary conditions, different primers (e.g., having different refractive indices) can provide the coating with different absorbance spectra and, hence, with different colors.

A third dielectric layer 162 can be deposited over the second metallic layer 158 (e.g., over the second primer film 160). The third dielectric layer 162 can also include one or more metal oxide or metal alloy oxide-containing layers, such as discussed above with respect to the first and second dielectric layers 140, 150. In one example, the third dielectric layer 162 is a multi-film layer similar to the second dielectric layer 150. For example, the third dielectric layer 162 can include a first metal oxide layer 164, e.g., a zinc oxide layer, a second metal alloy oxide-containing layer 166, e.g., a zinc stannate layer deposited over the zinc oxide layer 164, and an optional third metal oxide layer 168, e.g., another zinc oxide layer, deposited over the zinc stannate layer 166. In one example, both of the zinc oxide layers 164, 168 are present and each has a thickness in the range of 50 Å to 200 Å, such as 75 Å to 150 Å, such as 80 Å to 150 Å, such as 95 Å to 120 Å. The metal alloy oxide layer 166 can have a thickness in the range of 100 Å to 800 Å, e.g., 200 Å to 700 Å, e.g., 300 Å to 600 Å, e.g., 380 Å to 500 Å, e.g., 380 Å to 450 Å.

In one example, the total thickness of the third dielectric layer 162 (e.g., the combined thicknesses of the zinc oxide and zinc stannate layers) is in the range of 200 Å to 1000 Å, e.g., 400 Å to 900 Å, e.g., 500 Å to 900 Å, e.g., 650 Å to 800 Å, e.g., 690 Å to 720 Å.

A third heat and/or radiation reflective metallic layer 170 is deposited over the third dielectric layer 162. The third reflective layer 170 can be of any of the materials discussed above with respect to the first reflective layer. In one non-limiting example, the third reflective layer 170 includes silver and has a thickness in the range of 25 Å to 300 Å, e.g., 50 Å to 300 Å, e.g., 50 Å to 200 Å, such as 70 Å to 151 Å, such as 100 Å to 150 Å, such as 137 Å to 150 Å. The third metallic layer is a continuous layer.

A third primer layer 172 is located over the third reflective layer 170. The third primer layer 172 can be as described above with respect to the first or second primer layers. In one non-limiting example, the third primer layer is titanium and has a thickness in the range of 5 Å to 50 Å, e.g., 10 Å to 33 Å, e.g., 20 Å to 30 Å.

A fourth dielectric layer 174 is located over the third reflective layer (e.g., over the third primer layer 172). The fourth dielectric layer 174 can be comprised of one or more metal oxide or metal alloy oxide-containing layers, such as those discussed above with respect to the first, second, or third dielectric layers 140, 150, 162. In one non-limiting example, the fourth dielectric layer 174 is a multi-film layer having a first metal oxide layer 176, e.g., a zinc oxide layer, deposited over the third primer film 172, and a second metal alloy oxide layer 178, e.g., a zinc stannate layer, deposited over the zinc oxide layer 176. In one non-limiting embodiment, the zinc oxide layer 176 can have a thickness in the range of 25 Å to 200 Å, such as 50 Å to 150 Å, such as 60 Å to 100 Å, such as 80 Å to 90 Å. The zinc stannate layer 178 can have a thickness in the range of 25 Å to 500 Å, e.g., 50 Å to 500 Å, e.g., 100 Å to 400 Å, e.g., 150 Å to 300 Å, e.g., 150 Å to 200 Å, e.g., 170 Å to 190 Å.

In one non-limiting example, the total thickness of the fourth dielectric layer 174 (e.g., the combined thicknesses of the zinc oxide and zinc stannate layers) is in the range of 100 Å to 800 Å, e.g., 200 Å to 600 Å, e.g., 250 Å to 400 Å, e.g., 250 Å to 270 Å.

An overcoat 180 can be located over the fourth dielectric layer 174. The overcoat 180 can help protect the underlying coating layers from mechanical and chemical attack. The overcoat 180 can be, for example, a metal oxide or metal nitride layer. For example, the overcoat 180 can be titania having a thickness in the range of 10 Å to 100 Å, such as 20 Å to 80 Å, such as 30 Å to 50 Å, such as 30 Å to 45 Å. Other materials useful for the overcoat include other oxides, such as silica, alumina, or a mixture of silica and alumina.

In one non-limiting embodiment, the transparency 10 has a percent reflectance (% R) of visible light from the No. 1 surface in the range of 5% to 50%, such as 20% to 40%, such as 25% to 30%. The transparency 10 has a visible light transmittance of greater than 20%, such as greater than 30%, such as greater than 40%. The transparency has a solar heat gain coefficient (SHGC) of less than 0.3, such as less than 0.27, such as less than 0.25.

The ply coated with the coating 130 can be tempered or heat treated without adversely impacting upon the performance characteristics of the article or producing haze. Also, the article of the invention has a neutral or moderate reflected color, such as blue or blue-green, in both reflection and transmission.

Figure 4:
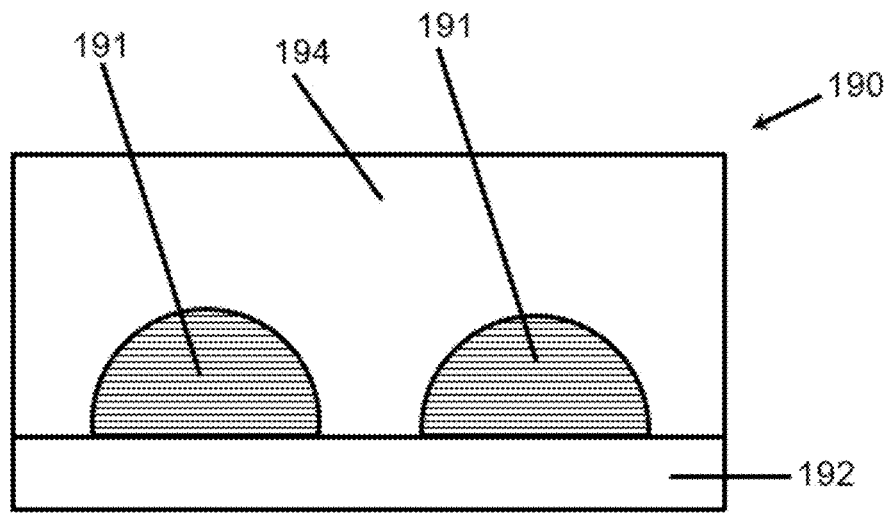
FIG. 4 depicts a portion of a discontinuous metal layer, for example as described in relation to FIG. 3.

The lack of haze upon heating is believed due to the islanded structure of the discontinuous intermediate metallic layer. A side view of a subcritical metallic layer 190 having discontinuous coating regions 191 formed on a dielectric layer 192 and covered by a primer layer 194 is shown in FIG. 4. The subcritical metal thickness causes the metal material to form discontinuous regions or islands of metal or metal oxide on the dielectric layer 192. When the primer layer is applied over the subcritical metal layer, the material of the primer layer covers the islands and can also extend into the gaps between adjacent islands of the subcritical metal and contact the underlying layer 192.

The coating 130 provides various advantages over known coatings. For example, the subcritical metallic layer increases the visible light absorbance of the coating, making the coated article darker. The combination of the subcritical metallic layer with selected thicknesses of the dielectric layers can provide the coated article with an asymmetrical reflectance. The color of the article can be tuned in transmission by changing the primer(s) used in the coating. Also, the coating of the invention is able to be heat treated without introducing haze.

It is to be understood that the previously described coating 130 is not limiting to the invention. For example, the subcritical metallic layer is not required to be the second (intermediate) metallic layer in the stack. The subcritical metallic layer could be placed anywhere in the coating stack. Also, for coating stacks having a plurality of metallic coating layers, more than one of the metallic layers could be a subcritical metallic layer.

While the above example included two continuous metal layers and one discontinuous metal layer, it is to be understood that this is just one non-limiting example. In the broad practice of the invention, the coating of the invention could include multiple continuous metallic layers and multiple discontinuous metallic layers. For example, a coated article could include a single subcritical metallic layer located between two dielectric layers. Or, the coating could include 3 or more metallic layers, such as 4 or more metallic layers, such as 5 or more metallic layers, such as 6 or more metallic layers, with at least one of the metallic layers being a subcritical metallic layer. Variations of the coating 130 are further described in U.S. Pat. No. 9,604,875.

Articles having two or more silver coating layers in a solar control coating are broadly-known. In one example, a solar control transparencies include a substrate, and over the substrate, from one to four iterations of a layer comprising, in order in a direction away from a substrate, a dielectric layer, a metallic layer, and a primer layer, e.g., as disclosed in U.S. Pat. No. 7,910,229, describing a coating with three silver layers, or U.S. Patent Application Publication No. 20110117300, describing a high solar heat gain coefficient coating having two silver layers. One or more metallic layers may be discontinuous, for example as described below.

Commercial products including tempered and non-tempered versions of the articles described below, with tempered product (e.g., SOLARGATE® 460VT, or SOLARBAN® 70 VT) requiring thicker primer layers, as compared to primer layer thickness of the non-tempered product (e.g., SOLARGATE® 460, or SOLARBAN® 70 XL), and, with the exception of any subcritical (discontinuous) silver layer, which cannot be increased in thickness without changing its unique optical properties, thickness of one or more continuous silver layers can be increased and thicknesses of one or more primer layers is increased in the tempered product as compared to the non-tempered product. In one aspect, thickness of one or more of the flash annealed primer layers is between the thickness of the non-tempered product and the tempered product, for example where one or more primer layers has a thickness ranging from the thickness of a primer layer in the non-tempered product plus 20% to 80%, or 30% to 70%, of the thickness difference between the primer layer thicknesses in the tempered product minus the primer layer thicknesses in the non-tempered products.

Figure 5:
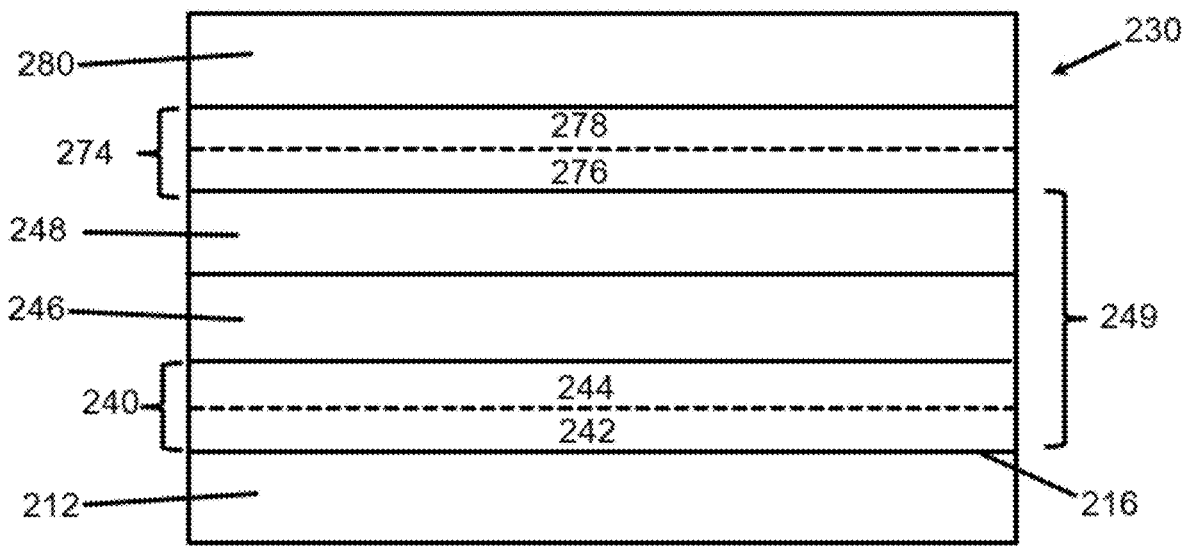
FIG. 5 depicts a coated glass article having one or more reflective metallic layers.

As shown in FIG. 5, an exemplary coating 130 includes a base layer or first dielectric layer 240 deposited over at least a portion of a major surface of a substrate (e.g., the No. 2 surface 216 of the first ply 212). The first dielectric layer 240 can be a single layer or can comprise more than one film of antireflective materials and/or dielectric materials, such as, but not limited to, metal oxides, oxides of metal alloys, nitrides, oxynitrides, or mixtures thereof. The first dielectric layer 240 can be transparent to visible light. Examples of suitable metal oxides for the first dielectric layer 240 include oxides of titanium, hafnium, zirconium, niobium, zinc, bismuth, lead, indium, tin, and mixtures thereof. These metal oxides can have small amounts of other materials, such as manganese in bismuth oxide, tin in indium oxide, etc. Additionally, oxides of metal alloys or metal mixtures can be used, such as oxides containing zinc and tin (e.g., zinc stannate, defined below), oxides of indium-tin alloys, silicon nitrides, silicon aluminum nitrides, or aluminum nitrides. Further, doped metal oxides, such as antimony or indium doped tin oxides or nickel or boron doped silicon oxides, can be used. The first dielectric layer 240 can be a substantially single phase film, such as a metal alloy oxide film, e.g., zinc stannate, or can be a mixture of phases composed of zinc and tin oxides or can be composed of a plurality of films.

For example, the first dielectric layer 240 (whether a single film or multiple film layer) can have a thickness in the range of 100 Å to 600 Å, such as 100 Å to 500 Å, such as 100 Å to 350 Å, such as 150 Å to 300 Å, such as 200 Å to 250 Å, such as 210 Å to 220 Å.

The first dielectric layer 240 can comprise a multi-film structure having a first film 142, e.g., a metal alloy oxide film, deposited over at least a portion of a substrate (such as the inner major surface 216 of the first ply 212) and a second film 244, e.g., a metal oxide or oxide mixture film, deposited over the first metal alloy oxide film 242. In one non-limiting embodiment, the first film 242 can be zinc stannate.

For example, the first film 242 can be zinc stannate and the second film 244 can be zinc oxide (for example, 90 wt. % zinc oxide and 10 wt. % tin oxide). For example, the first film 242 can comprise zinc stannate having a thickness in the range of 50 Å to 600 Å, such as 50 Å to 500 Å, such as 75 Å to 350 Å, such as 100 Å to 250 Å, such as 100 Å to 200 Å, such as 100 Å to 150 Å, such as 140 Å to 150 Å.

The second film 244 can comprise zinc oxide having a thickness in the range of 50 Å to 200 Å, such as 50 Å to 150 Å, such as 70 Å to 100 Å.

In another exemplary coating, the first dielectric layer 240 comprises a first layer comprising zinc stannate, a second layer comprising zinc oxide, a third layer comprising zinc stannate, and a fourth layer comprising zinc oxide, wherein the first dielectric layer has a thickness in the range of 44 nm to 48 nm, the first layer and third layer each have a thickness in the range of 16 nm to 17 nm, and the second layer and fourth layer each have a thickness in the range of 6 nm to 8 nm.

A first heat and/or radiation reflective metallic layer 246 can be deposited over the first dielectric layer 240. The first reflective layer 246 can include a reflective metal, such as, but not limited to, metallic gold, copper, palladium, silver, or mixtures, alloys, or combinations thereof. In one embodiment, the first reflective layer 246 comprises a metallic silver layer having a thickness in the range of 25 Å to 300 Å, e.g., 50 Å to 300 Å, e.g., 50 Å to 250 Å, e.g., 50 Å to 200 Å, such as 70 Å to 200 Å, such as 100 Å to 200 Å, such as 120 Å to 180 Å.

A first primer layer 248 is located over the first reflective layer 246. The first primer layer 148 can be a single film or a multiple film layer. The first primer layer 248 can include an oxygen-capturing material that can be sacrificial during the deposition process to prevent degradation or oxidation of the first reflective layer 246 during the sputtering process or subsequent heating processes. The first primer layer 248 can also absorb at least a portion of electromagnetic radiation, such as visible light, passing through the coating 230. Examples of materials useful for the first primer layer 248 include titanium, Inconel, Stellite®, and mixtures thereof. For example, the first primer layer 248 can have a thickness in the range of 5 Å to 50 Å, e.g., 10 Å to 40 Å, e.g., 20 Å to 40 Å, e.g., 20 Å to 30 Å. In one example, the first primer 148 is titanium.

An optional outer dielectric layer 274 is located over the outermost iteration of the primer film 248. The outer dielectric layer 274 can be comprised of one or more metal oxide or metal alloy oxide-containing layers, such as those discussed above with respect to the first dielectric layers 240. In one non-limiting example, the outer dielectric layer 274 is a multi-film layer having a first metal oxide layer 276, e.g., a zinc oxide layer, deposited over the third primer film 272, and a second metal alloy oxide layer 278, e.g., a zinc stannate layer, deposited over the zinc oxide layer 276. In one non-limiting embodiment, the zinc oxide layer 276 can have a thickness in the range of 25 Å to 200 Å, such as 50 Å to 150 Å, such as 60 Å to 100 Å, such as 70 Å to 90 Å. The zinc stannate layer 278 can have a thickness in the range of 25 Å to 500 Å, e.g., 50 Å to 500 Å, e.g., 100 Å to 400 Å, e.g., 150 Å to 300 Å, e.g., 150 Å to 200 Å, e.g., 170 Å to 200 Å.

In aspects, one, two, three, or four additional iterations of the assembly 249 including the dielectric layer 240, the heat and/or radiation reflective metallic layer 246, and the primer layer 248, may be deposited over the primer layer and beneath the outer dielectric layer 274. In one aspect, where there are two or more iterations of assembly 249, one or more of the heat and/or radiation reflective metallic layers 246, is subcritical, for example and without limitation, as shown in FIG. 4.

In one non-limiting example, the total thickness of the outer dielectric layer 274 (e.g., the combined thicknesses of the zinc oxide and zinc stannate layers) is in the range of 100 Å to 800 Å, e.g., 200 Å to 600 Å, e.g., 250 Å to 400 Å, e.g., 250 Å to 270 Å.

An overcoat 280 can be located over the fourth dielectric layer 274. The overcoat 280 can help protect the underlying coating layers from mechanical and chemical attack. The overcoat 280 can be, for example, a metal oxide or metal nitride layer. For example, the overcoat 280 can be titania having a thickness in the range of 10 Å to 100 Å, such as 20 Å to 80 Å, such as 30 Å to 50 Å, such as 30 Å to 40 Å.

Figure 6:
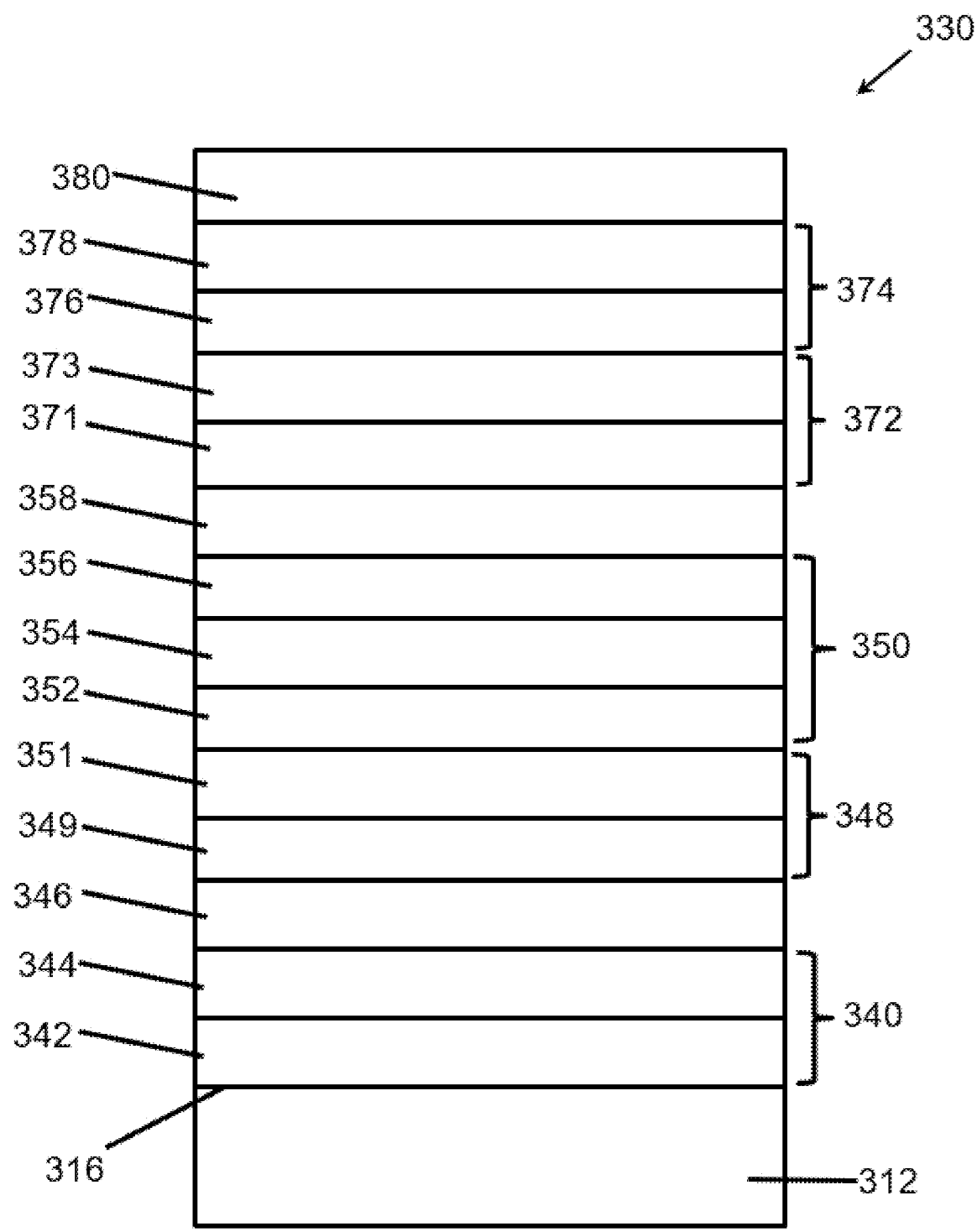
FIG. 6 depicts a coated glass article having three reflective metallic layers.

Another exemplary non-limiting coating 330 is shown in FIG. 6. This exemplary coating 330 includes a base layer or first dielectric layer 340 deposited over at least a portion of a major surface of a substrate (e.g., the No. 2 surface 16 of the first ply 12). The first dielectric layer 340 can be similar to the first dielectric layer 40 described above. For example, the first dielectric layer 340 can be a single layer or can comprise more than one film of antireflective materials and/or dielectric materials, such as, but not limited to, metal oxides, oxides of metal alloys, nitrides, oxynitrides, or mixtures thereof. The first dielectric layer 340 can be transparent to visible light. Examples of suitable metal oxides for the first dielectric layer 340 include oxides of titanium, hafnium, zirconium, niobium, zinc, bismuth, lead, indium, tin, and mixtures thereof. These metal oxides can have small amounts of other materials, such as manganese in bismuth oxide, tin in indium oxide, etc. Additionally, oxides of metal alloys or metal mixtures can be used, such as oxides containing zinc and tin (e.g., zinc stannate, defined below), oxides of indium-tin alloys, silicon nitrides, silicon aluminum nitrides, or aluminum nitrides. Further, doped metal oxides, such as antimony or indium doped tin oxides or nickel or boron doped silicon oxides, can be used. The first dielectric layer 340 can be a substantially single phase film, such as a metal alloy oxide film, e.g., zinc stannate, or can be a mixture of phases composed of zinc and tin oxides or can be composed of a plurality of films.

For example, the first dielectric layer 340 (whether a single film or multiple film layer) can have a thickness in the range of 100 Å to 800 Å, such as 100 Å to 600 Å, such as 200 Å to 600 Å, such as 400 Å to 500 Å, such as 440 Å to 500 Å.

The first dielectric layer 340 can comprise a multi-film structure having a first film 342, e.g., a metal alloy oxide film, deposited over at least a portion of a substrate (such as the inner major surface 16 of the first ply 12) and a second film 344, e.g., a metal oxide or oxide mixture film, deposited over the first metal alloy oxide film 342. In one non-limiting embodiment, the first film 342 can be zinc stannate.

For example, the first film 342 can be zinc stannate and the second film 344 can be zinc oxide (for example, 90 wt. % zinc oxide and 10 wt. % tin oxide). For example, the first film 342 can comprise zinc stannate having a thickness in the range of 50 Å to 600 Å, such as 50 Å to 500 Å, such as 75 Å to 400 Å, such as 200 Å to 400 Å, such as 300 Å to 400 Å, such as 355 Å to 400 Å.

The second film 344 can comprise zinc oxide having a thickness in the range of 50 Å to 200 Å, such as 50 Å to 150 Å, such as 85 Å to 100 Å.

A first heat and/or radiation reflective metallic layer 346 can be deposited over the first dielectric layer 340. The first reflective layer 346 can include a reflective metal, such as, but not limited to, metallic gold, copper, silver, or mixtures, alloys, or combinations thereof. In one embodiment, the first reflective layer 346 comprises a metallic silver layer having a thickness in the range of 25 Å to 300 Å, e.g., 50 Å to 300 Å, e.g., 50 Å to 250 Å, e.g., 50 Å to 200 Å, such as 70 Å to 200 Å, such as 70 Å to 100 Å, such as 73 Å to 100 Å.

A first primer layer 348 is located over the first reflective layer 346. The first primer layer 348 can be a single film or a multiple film layer. The first primer layer 348 can include an oxygen-capturing material that can be sacrificial during the deposition process to prevent degradation or oxidation of the first reflective layer 346 during the sputtering process or subsequent heating processes. The first primer layer 348 can also absorb at least a portion of electromagnetic radiation, such as visible light, passing through the coating 330. Examples of materials useful for the first primer layer 348 include titanium, Inconel, Stellite®, and mixtures thereof. For example, the first primer layer 348 can be a multi-film layer having a first primer film 349 and a second primer film 351. The first and second primer films 349, 351 are typically of different materials. For example, the first primer film 349 can be Inconel having a thickness in the range of 1 Å to 10 Å, e.g., 1 Å to 5 Å. The second primer film 351 can be titanium having a thickness in the range of 5 Å to 20 Å, e.g., 10 Å to 15 Å.

A second dielectric layer 350 is located over the first reflective layer 346 (e.g., over the first primer layer 348). The second dielectric layer 350 can comprise one or more metal oxide or metal alloy oxide-containing films, such as those described above with respect to the first dielectric layer 340. For example, the second dielectric layer 350 can include a first metal oxide film 352, e.g., a zinc oxide film, deposited over the first primer film 348 and a second metal alloy oxide film 354, e.g., a zinc stannate (Zn2SnO4) film, deposited over the first zinc oxide film 352. An optional third metal oxide film 356, e.g., another zinc oxide layer, can be deposited over the zinc stannate layer.

The second dielectric layer 350 can have a total thickness (e.g., the combined thicknesses of the layers if more than one layer is present) is in the range of 50 Å to 1000 Å, e.g., 50 Å to 800 Å, e.g., 100 Å to 800 Å, e.g., 200 Å to 800 Å, e.g., 500 Å to 700 Å, e.g., 650 Å to 700 Å.

For example, for a multi-film layer, the zinc oxide film 352 (and optional third zinc oxide film 356, if present) can have a thickness in the range of 10 Å to 200 Å, e.g., 50 Å to 200 Å, e.g., 50 Å to 150 Å, e.g., 50 Å to 75 Å. The metal alloy oxide layer (zinc stannate) 54 can have a thickness in the range of 50 Å to 800 Å, e.g., 50 Å to 500 Å, e.g., 100 Å to 500 Å, e.g., 400 Å to 500 Å.

A reflective metallic layer 358 is located over the second dielectric layer 350 (e.g., over the third zinc oxide film 356, if present, or over the zinc stannate film 354 if not). In one non-limiting embodiment, the second reflective layer 358 comprises silver having a thickness in the range of 50 Å to 300 Å, e.g., 100 Å to 200 Å, e.g., 150 Å to 200 Å, e.g., 170 Å to 200 Å.

A second primer layer 372 can be deposited over the second reflective layer 358. The second primer layer 372 can be as described above with respect to the first primer layer 348. For example, the second primer layer 372 can be a multi-film layer having a first primer film 371 and a second primer film 373. The first and second primer films 371, 373 are typically of different materials. For example, the first primer film 371 can be Inconel having a thickness in the range of 1 Å to 15 Å, e.g., 5 Å to 10 Å. The second primer film 373 can be titanium having a thickness in the range of 5 Å to 20 Å, e.g., 10 Å to 15 Å.

A third dielectric layer 374 can be deposited over the second reflective layer 358 (e.g., over the second primer film 372). The third dielectric layer 374 can also include one or more metal oxide or metal alloy oxide-containing layers, such as discussed above with respect to the first and second dielectric layers 340, 350. In one example, the third dielectric layer 374 is a multi-film layer similar to the second dielectric layer 350. In one non-limiting example, the third dielectric layer 374 is a multi-film layer having a first metal oxide layer 376, e.g., a zinc oxide layer, deposited over the second primer layer 372, and a second metal alloy oxide layer 378, e.g., a zinc stannate layer, deposited over the zinc oxide layer 376. In one non-limiting embodiment, the zinc oxide layer 376 can have a thickness in the range of 25 Å to 200 Å, such as 50 Å to 150 Å, such as 100 Å to 150 Å. The zinc stannate layer 378 can have a thickness in the range of 25 Å to 500 Å, e.g., 50 Å to 500 Å, e.g., 100 Å to 400 Å, e.g., 200 Å to 350 Å, e.g., 300 Å to 350 Å, e.g., 320 Å to 350 Å.

In one non-limiting example, the total thickness of the third dielectric layer 374 (e.g., the combined thicknesses of the zinc oxide and zinc stannate layers) is in the range of 100 Å to 800 Å, e.g., 200 Å to 600 Å, e.g., 250 Å to 500 Å, e.g., 470 Å to 500 Å.

An overcoat 380 can be located over the third dielectric layer 374. The overcoat 380 can help protect the underlying coating layers from mechanical and chemical attack. The overcoat 380 can be, for example, a metal oxide or metal nitride layer. For example, the overcoat 380 can be titania having a thickness in the range of 10 Å to 100 Å, such as 20 Å to 80 Å, such as 30 Å to 50 Å, such as 30 Å to 40 Å.

The following Examples illustrate various embodiments of the invention. However, it is to be understood that the invention is not limited to these specific embodiments.

In one aspect, a coating is flashed in a pattern to produce a transmittance and/or reflective pattern in the coating. Patterns in coatings are useful for a variety of reasons, ranging from the aesthetic to the functional. For example, a pattern may be produced to make a transparency more visible to wildlife, e.g. to reduce collisions with birds, to create a desirable aesthetic effect, or to create a partial privacy screen or a graded density or effect. In another aspect, a coating is patterned to create a pattern of low resistivity, e.g. circuits, in the coating, for example, for use in electro-optical devices. In one aspect, the pattern is created by interposing a filter or opaque object or mask, such as a sheet between the flash lamp and the coating to be flashed.

Figure 7:
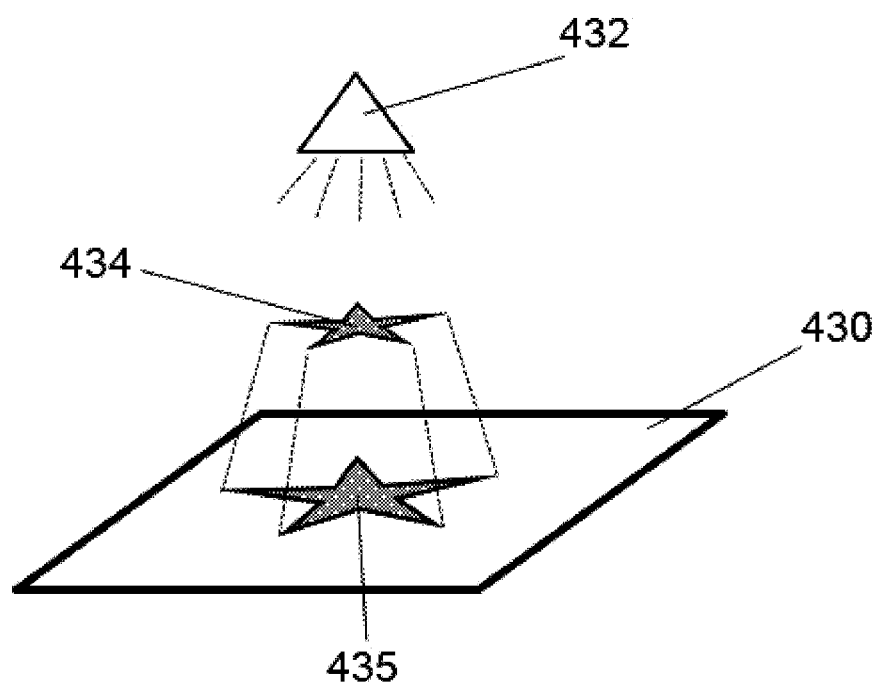
FIG. 7 depicts schematically a method of patterning an article by a flash annealing method as described herein.

Referring to FIG. 7, a coating 430, e.g., deposited over at least a portion of a major surface of a substrate (e.g., the No. 2 surface 16 of the first ply 12), is flashed as described herein using a flash lamp 432. A mask 434 is interposed between the flash lamp 432 and the coating 430, producing a shadowing effect, resulting in differential application of light in a pattern on the coating 430. Because the shadowing effect causes different light treatment over the surface of the coating layers of the coating are exposed to different light intensities, and therefore result in a pattern of any aspect of layer(s) of the coating affected by the light, including but not limited to changes in transmittance or reflective color values (e.g. L*a*b* values), transmittance, reflectivity, haze, crystallinity, and/or sheet resistance. The mask 434 is shown in an intermediary position between the flash lamp 432 and coating 430. In practice, the mask can be placed at any position between the lamp 432 and coating 430 effective to produce a desired masking effect. Because the light source is incoherent and not necessarily a point source, in one aspect, it may be preferable to place the mask 434 directly on, or as close as possible to the coating 430 to create a more sharply-defined pattern. In another aspect, it may be preferable to place the mask as shown, or in a position between the coating 430 and the flash lamp 432 to create a softer, less sharply-defined pattern. As would be apparent to one of ordinary skill, the use of a star as the mask 434 is merely exemplary, and the mask 434 can have any desired shape and transparency, and, when less than 100% opaque, the mask 434 can have a desired coloring and/or transmittance (acting as a color or neutral density filter) to filter the light from the flash lamp 432, effecting a partial masking of the coating 430. In other aspects, multiple masks may be used. In still other aspects, the mask 434 may have a gradient of transmittance (acting as a neutral density gradient filter) and/or color (acting as a color gradient filter), to produce a gradient pattern on the coating 430.

Example 1

Figure 8:
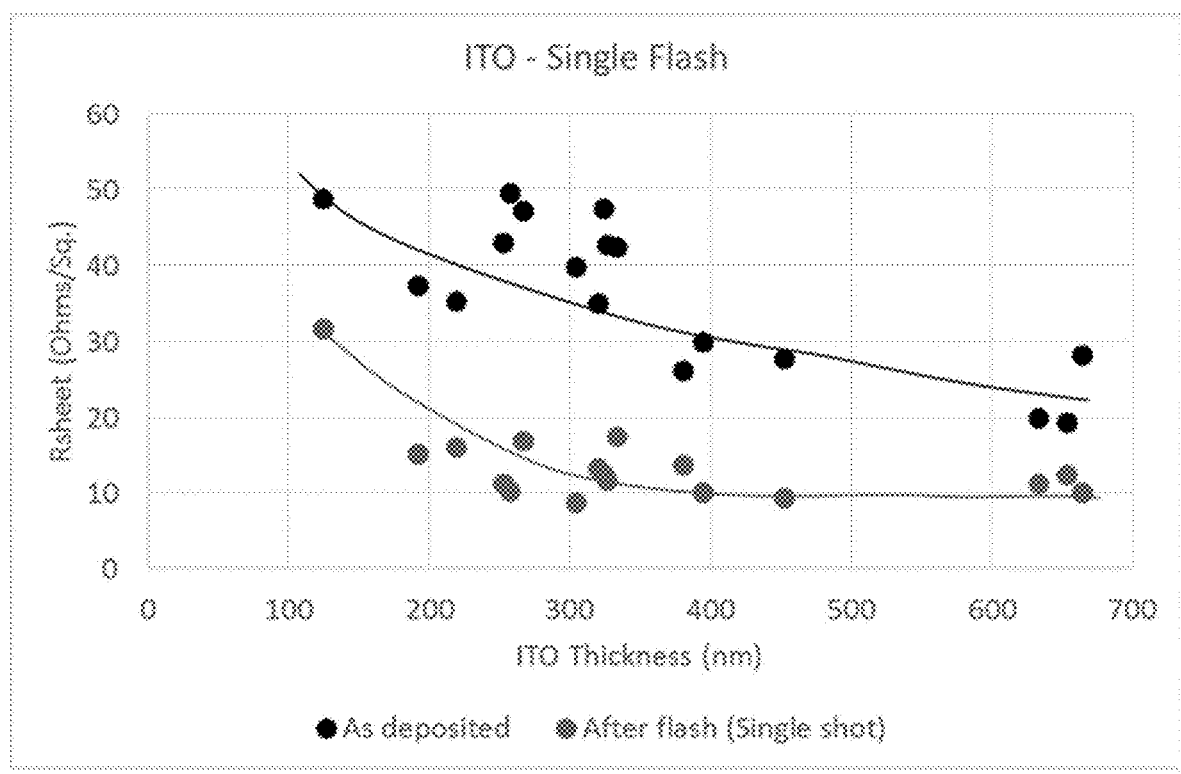
FIG. 8 provides a graph showing variation of sheet resistance as a function of thickness for various ITO layer thicknesses.
Figure 9:
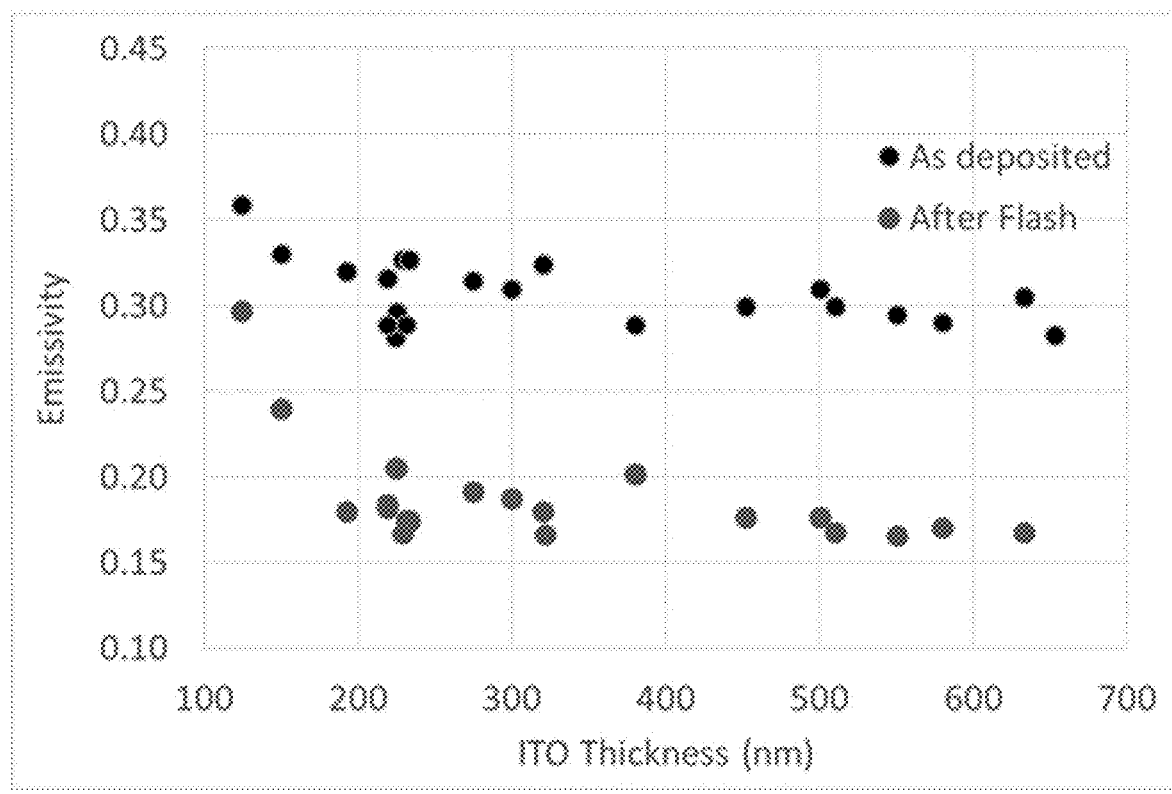
FIG. 9 Provides a graph showing variation of emissivity as a function of thickness for various ITO layer thicknesses.

ITO-coated glass articles were prepared by MSVD deposition of an ITO layer onto 3.2 mm thick float glass in argon with varying pressure and percentages of $O_2$, to the thickness indicated in FIG. 8. The articles were flashed at room temperature (~22° C.) with a single pulse of 500 micro seconds and ~4-5 J/cm². Sheet resistance was measured using a four point probe and results are provided in FIG. 8. Adequate sheet resistance (<30Ω/□), with sheet resistances of less than 20Ω/□ for layers of over 125 nm. Emissivity for the same coated articles was evaluated by standard methodology, with the results depicted in FIG. 9, showing that for ITO layers of over 150 nm in thickness, and especially in the range of from 250 nm to 350 nm, emissivity changes over two- to five-fold and is raised to 35Ω/□.

Example 2

Figure 10A:
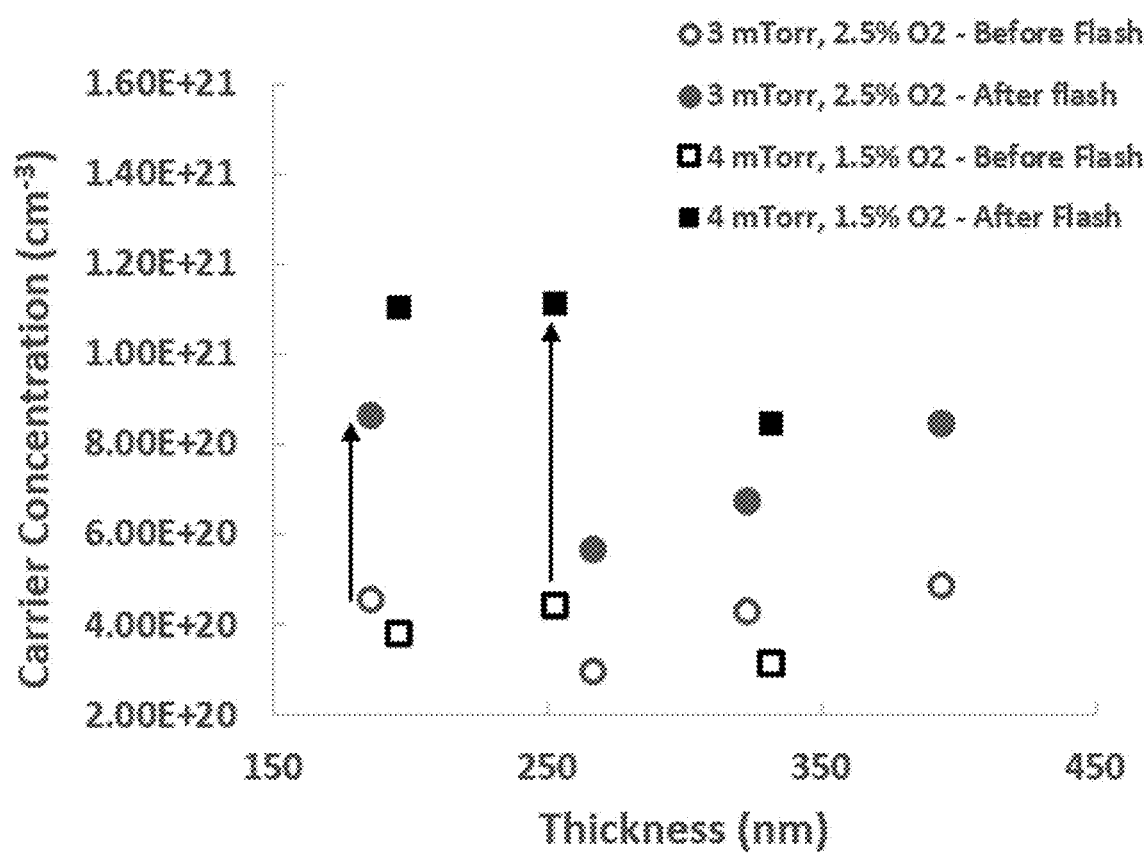
FIGS. 10A and 10B provide Hall measurements, carrier concentration (FIG. 10A) and mobility (FIG. 10B) for ITO layers of varying thickness deposited at 3 mTorr with 2.5% (% volume) oxygen or 4 mTorr with 1.5% oxygen.
Figure 10B:
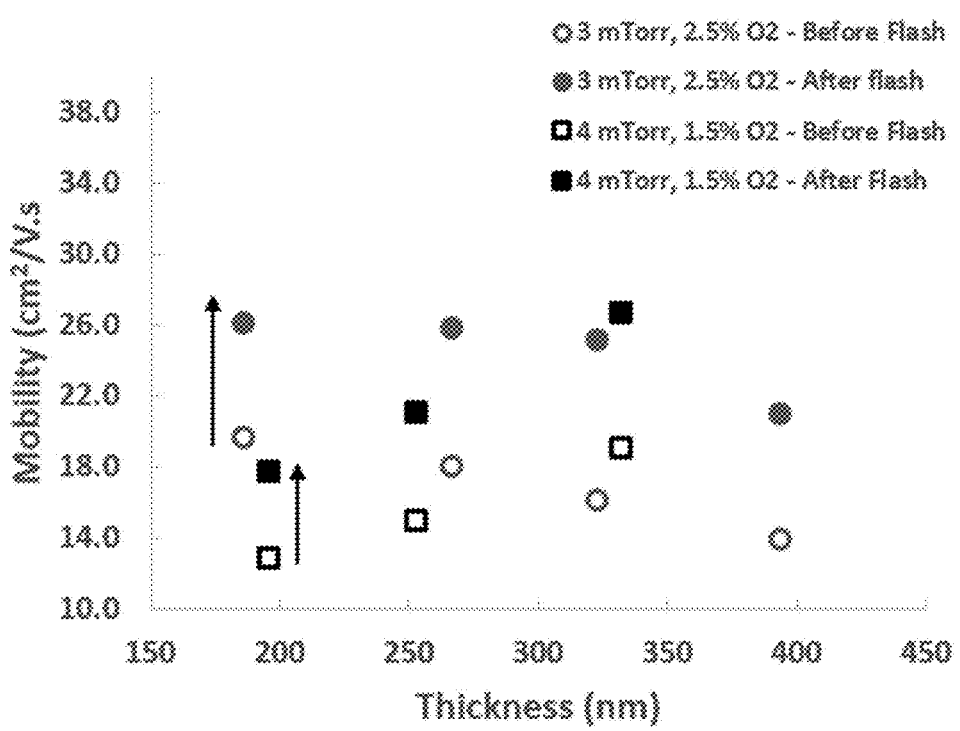

ITO-coated articles were prepares essentially as indicated in Example 1, except that the pressure, O2 percentage and thicknesses were varied as indicated in FIGS. 10A and 10B. The samples were flashed with a ~500 microseconds pulse from a Xenon lamp at ~4-5 J/cm². Hall measurements (carrier concentration and carrier mobility) were measured by standard methods. As can be seen in FIGS. 10A and 10B, carrier mobility and concentration increased after flashing, indicating an overall increase in conductivity, but the greatest increase in carrier concentration was seen for the ITO deposited at 4 mTorr and 1.5% $O_2$.

Example 3

ITO-coated articles were prepared essentially as in Example 1, with the exception that all samples had ITO layers of 250 nm thickness, deposited by MSVD in argon at 4 mTorr, with 0%, 1.5%, or 2.5% $O_2$. Transmission was measured spectrophotometrically, and Normalized absorption was calculated from transmission and reflection data. Results are shown in FIGS. 11A and 11B. Integrated transmittance is indicated for two sample sets. Samples were flashed with a single pulse of ~500 microseconds at ~4-5 J/cm². Significant differences are seen in transmittance and normalized absorption between pre-flashed and flashed samples within the visible and near infrared spectra for 0% and 1.5% $O_2$ samples, while little effect is see with 2.5% $O_2$, indicating that oxygen-deficient ITO is more reactive to flashing.

Example 4

Figure 12:
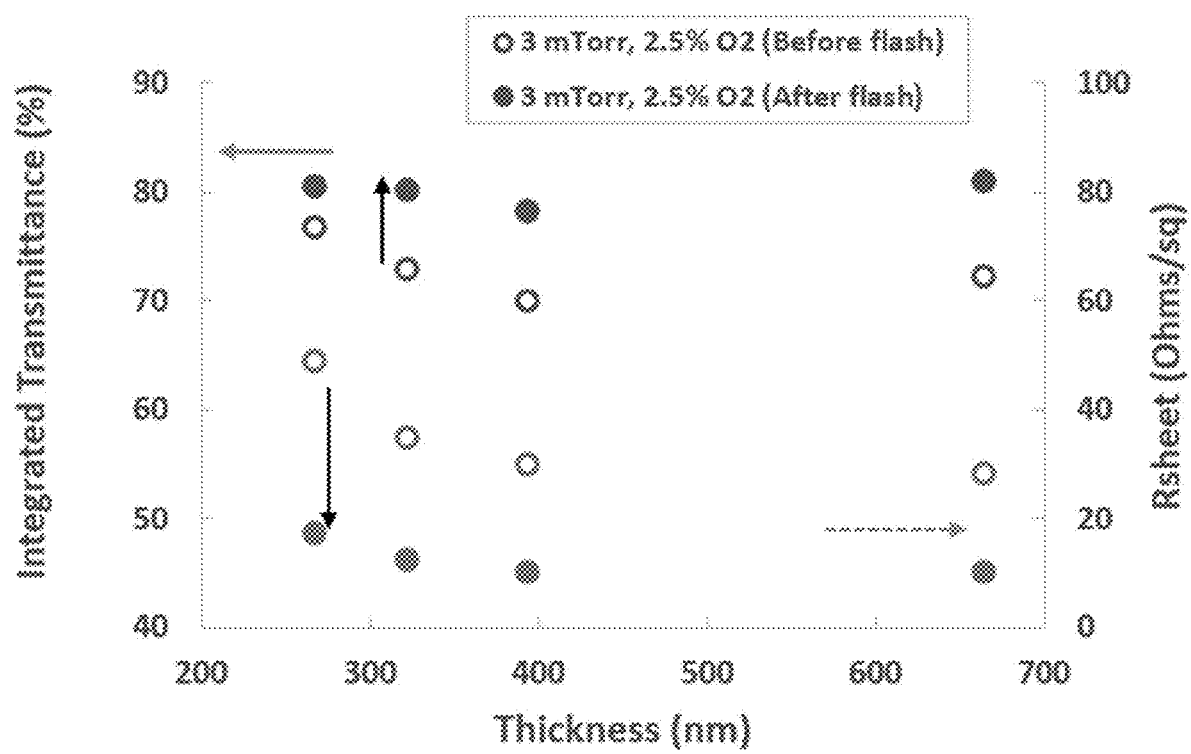
FIG. 12 provides a graph showing optical and electrical properties of ITO layers of varying thicknesses.

ITO-coated articles were prepares essentially as indicated in Example 1, except that the pressure, $O_2$ percentage was 3 mTorr and 2.5% $O_2$, and thicknesses were varied as indicated in FIG. 12. The samples were flashed with a ~500 microseconds pulse from a Xenon lamp at ~4-5 J/cm². Sheet resistance and integrated transmittance were evaluated by standard methods. As can be seen in FIG. 12, for ITO deposited at 4 mTorr and 1.5% $O_2$, for sheets ranging from 250 nm to greater than 650 nm low sheet resistance and transmittance can be obtained by flash annealing.

Example 5

Figure 13B:
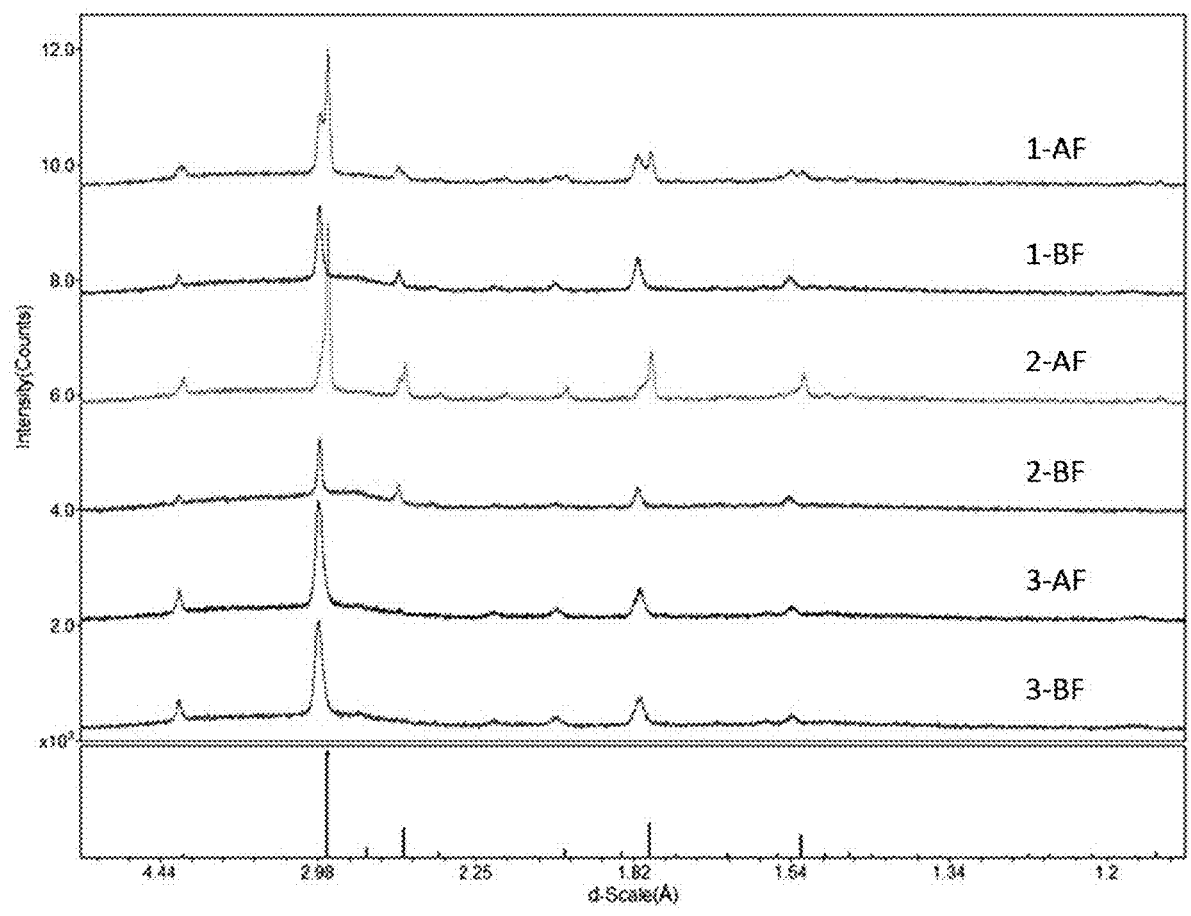
FIG. 13B provides XRD traces for the same samples.

ITO-coated articles were prepared essentially as described in Example 1, with the exception that the ITO layer thickness was approximately 300 nM. Different ITO deposition conditions were used, resulting in absorption coefficient spectra as indicated in FIG. 13A, determined by standard methodology. The samples were flashed with a ~500 microseconds pulse from a Xenon lamp at ~4-5 J/cm². X-ray diffraction (XRD) traces were obtained by standard methodology for each sample (FIG. 13B). As can be seen in FIG. 13A, as the absorption coefficient increases for light between 425 nm and 500 nm, the penetration depth of the light decreases, and a shifting and enhancement of XRD peaks is seen for sample 2, while a splitting or bifurcating of peaks is seen for sample 3, indicative of the formation of two sub-layers from a single ITO layer.

As shown in FIG. 13A, the absorption coefficient of the layer affects the penetration depth of the flash. For layers of sufficient thickness and having sufficiently high absorption coefficients, the depth of penetration of the flash into the layer can be modulated such that the layer is only partially transformed, resulting in a split ITO layer having different physical characteristics. In such an instance, the ITO layer can be bifurcated into a first layer (closer to the flash lamp) that is physically converted by the flash, and a second layer (farther away from the flash) that is not. Thus, as shown in FIG. 13B, coatings with larger absorption coefficient (lower penetration depth) shows splitting. Coatings with intermediate absorption coefficient (and penetration depth) show shifting of the peaks. Coatings with highest penetration depth (lowest absorption) exhibit nearly no change in XRD pattern.

Example 6

Figure 14:
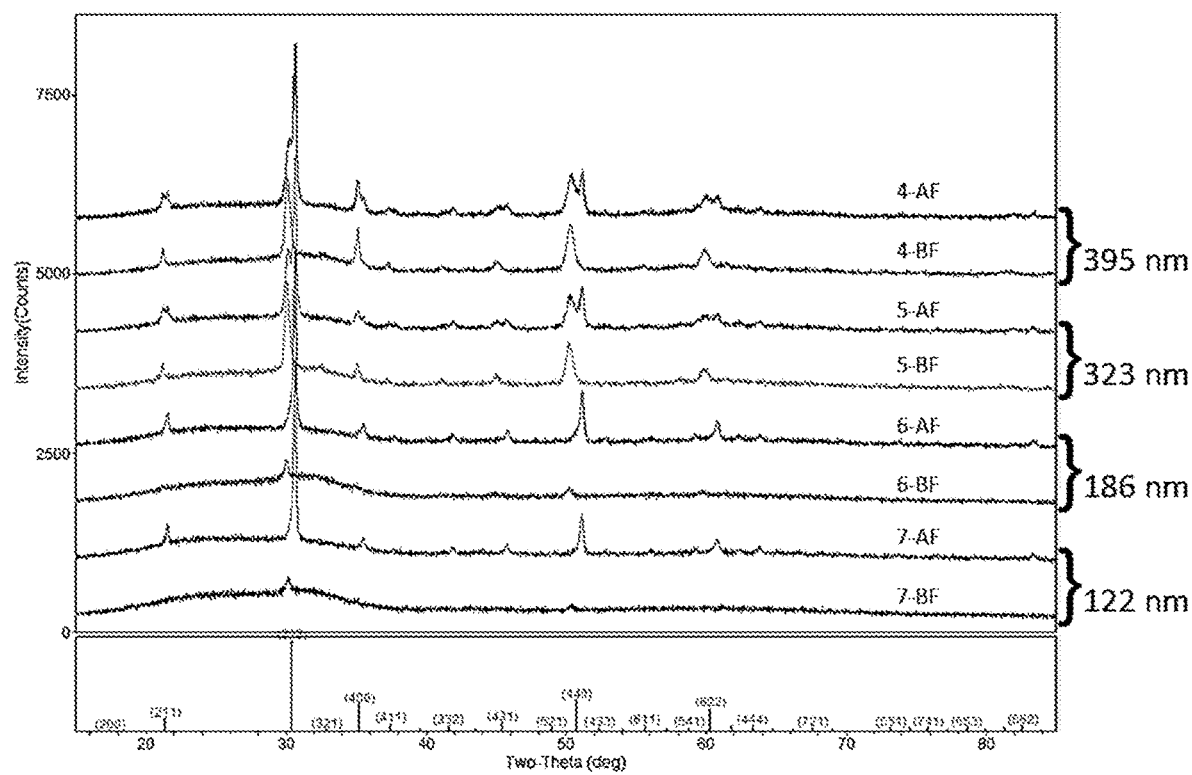
FIG. 14 shows XRD traces for four TCO layers with the same absorption coefficient, but different thicknesses as indicated before (BF) and after (AF) flash treatment.

ITO-coated articles were prepared essentially as described in Example 1, with the exception that the ITO layer thickness was as indicated in FIG. 14, and ITO was deposited at 4 mTorr with 1.5% $O_2$. The samples were flashed with a ~500 microseconds pulse from a Xenon lamp at ~4-5 J/cm². XRD diffraction traces are provided in FIG. 14. As can be seen, all thicknesses exhibited transformation as a result of flashing, but as the thickness of the layer increased, e.g. beyond the effective penetration depth of the light pulse for this particular ITO composition, bifurcation of the layer into two physically-different sub-layers is seen with thicknesses over 186 nm. For different ITO and TCO compositions, and for different flash spectra and intensities, bifurcation is expected to begin at different thicknesses.

Example 7

A 12"×12" sheet of a MSVD coating product was prepared on monolithic glass essentially as described in U.S. Patent Application Publication No. 20110117300, with, in order: substrate, a first dielectric layer (40-55 nm), a reflective layer (5.5-8.5 nm), a primer layer (0.5-6 nm), a second dielectric layer (15-45 nm), and a protective layer of up to 15 nm. These thicknesses are for an annealed product. It was found that use of primer thicknesses in this range resulted in haze and loss of visual quality after flashing. The nominal product described above was therefore modified to increase both primer thicknesses by 1 kW, to increase both primer thicknesses by 1.5 kW and to decrease top and center oxides by 3 kW, or to increase both primer thicknesses by 2 kW and to decrease top and center oxides by 3 kW.

NovaCentrix PulseForge 1300 system was used for flash heating the test substrates. The stage was set at a z-height of 13 mm. For the 'process development', 2"×2" squares of the coated glass were used with the PulseForge set to flash one time in 'fixed position' mode. The sheet resistance of these samples was measured before and after flash processing via 4-point probe.

The samples submitted for analytical analysis were 4"×4". The flash parameters used were the set identified as preferred based on the 2"×2" results, but as the piece was larger than the region covered by a single flash event, the mode was shifted to "once through" with overlap set at 2.0 and throughput set at 10 ft/min.

FIG. 15 shows flash conditions used in this assessment. The '1 kW' series of samples are all cut from one of the 12×12 s of Sungate 460 with the primer increased by 1 kW, the '1. SkW' series of samples are all cut from one of the 12×12 s of Sungate 460 with the primer increased by 1.5 kW, and the '2 kW' series of samples are all cut from one of the 12×12s of Sungate 460 with the primer increased by 2 kW. The 'Norn' series of samples are the cut from a 12×12 of nominal Sungate 460. The 'before flash' sheet resistances showed slight differences between the versions, with the nominal Sungate 460 before-flash sheet resistivity of approximately 3.68 Q/sq. being the highest, the '1 kW' and '1. SkW' series showing approximately 3.58 Q/sq. and the '2 kW' series measuring close to 3.63 Q/sq.

The lowest after-flash sheet resistivity sample from each 12×12 is highlighted in green. Note that in three of the green highlighted samples used 640V and 500 μs pulse duration for the flash annealing. Of these results, the three lowest after-flash resistances overall involved '1.5 kW' pieces under different flash conditions. The 12×12 showing the least benefit from the flash process was the sample A. "DAM" in the Rs after flash column is used to indicate a presumption of damage to the coating as a result of the flash; in these cases it is believed that the flash power, which increases both with increasing voltage and with increasing duration, was higher than the optimal level.

Based on this result, a 4"×4" piece of the 1.5 kW material was cut and flashed under the same flash setpoints (using "Once Through" mode, as described above}. Three total 4"×4" samples were prepared and submitted for emissivity and SHGC characterization, as follows: Sample A (NOM-4×4), unflashed Sample C, and flashed Sample C. FIGS. 16 and 17 are tables showing the visible color and performance properties, as simulated integrated into insulated glass devices using two lites of 3.2 mm clear glass and a 0.5" air gap, for five different coatings: the three described 4"×4" samples, a commercial annealed product, and a commercial tempered version of the annealed product.

As seen in FIG. 15, the lowest after-flash sheet resistivity is highlighted. Three of the highlighted samples used 640V and 500 μs flash duration, and the three lowest after-flash sheet resistances involved 1.5 kW primer pieces. Samples marked "DAM" were presumably damaged as a result of the flashing above an optimal range. Pieces of the 1.5 kW material were then flashed as above and compared to the nominal product described above and to commercial non-tempered (Sungate 460) and tempered (Sungate 460VT) commercial products using a computer simulation of insulated glass. As can be seen in FIG. 16, the flash-processed sample is very similar in color to the commercial products, with all three samples showing elevated transmittance as compared to the commercial products. As can be seen in FIG. 17, the flash-processed samples showed lower emissivity and higher solar heat gain coefficient.

Example 8

A three silver layer article was prepared essentially as described above, e.g. in reference to FIGS. 5 and 6, and corresponding to a commercial SOLARBAN® 70-based coatings, with the goal of determining whether a TL* increase could be achieved of a sufficient amount to be able to produce a non-tempered product that would closely match the commercial tempered product.

A sample set of variations on the non-annealed product was deposited on 5 mm clear glass. The sample set variations focused on changes in primer thicknesses and thicknesses of continuous silver layers. A set of five flash processing conditions was defined and performed on pieces cut from each coating; along with control (unflashed) samples. A set of 102 samples was characterized and analyzed, and optical modeling was used to determine layer thicknesses.

The 17 coating variations were compared to non-tempered (annealed) and tempered (VT) samples as shown in Table 1

TABLE 1

| | Silver Layer Variation (% increase above nominal) | | | | |
|---|---|---|---|---|---|
| Primer: | 0 | 1 | 2 | 3 | 221 |
| Annealed | 21C | | | | 22C |
| 30% | 26C | 25C | 24C | | 23C |
| 40% | 27C | 28C | 29C | 30C | 31C |
| 50% | 35C | 34C | 33C | | 32C |
| VT | 36C | | | | 37C |

In Table 1, the 0, 1, 2, 3, and 221 are % increases in each of the continuous silver layers. All the samples listed below '0' were deposited using nominal silver thickness (+0%) to each layer, each of the samples under '2' had silver cathode power increase by about 2%. The '221' refers to 2% increase to the bottom silver, 2% increase to the center silver, and 1% increase to the top silver. For the primers, 5 primer thicknesses were used, including annealed-level primer thickness, the VT level, and three intermediate primers with the % s referring to the fraction of thickness increase from annealed level to VT level. For example, sample "29C" was otherwise identical to production SOLARBAN®70XL except (1) each of the silver layer power levels (and therefore nominally silver thicknesses) was increased by about 2% and (2) each primer cathode power level was at a setpoint 40% of the way from the annealed power level increasing toward the VT power level.

Each sample was processed under 6 different flash processing conditions, referred to as "-C", and "-1" through "-5". The interpretation of these suffixes is given in Table 2:

TABLE 2

| Suffix | Voltage (V) | Duration (µs) | Reps | Notes |
|---|---|---|---|---|
| -C | NA | NA | NA | Unflashed control |
| -1 | 660 | 500 | 2 | |
| -2 | 660 | 500 | 1 | |
| -3 | 620 | 500 | 1 | |
| -4 | 675 | 500 | 1 | |
| -5 | | | | Recipe 19 |

Recipe 19 refers to a set of flash conditions that was observed to produce high TL* values. The process uses 19 flashes at generally increasing voltage as follows:

TABLE 3

| Flash | Voltage (V) | Duration (µs) |
|---|---|---|
| 1 | 540 | 500 |
| 2 | 545 | 500 |
| 3 | 550 | 500 |
| 4 | 555 | 500 |
| 5 | 560 | 500 |
| 6 | 560 | 500 |
| 7 | 560 | 500 |
| 8 | 560 | 500 |
| 9 | 565 | 500 |
| 10 | 567 | 500 |
| 11 | 569 | 500 |
| 12 | 569 | 500 |
| 13 | 571 | 500 |
| 14 | 573 | 500 |
| 15 | 575 | 500 |
| 16 | 577 | 500 |
| 17 | 579 | 500 |
| 18 | 581 | 500 |
| 19 | 583 | 500 |

Using this nomenclature, sample 36C-3 refers to a piece that was cut from a coating that was otherwise identical to the baseline SOLARBAN® 70XL except that it used VT primer power levels and was then flashed a single time at 620 V with a duration of 500 µs. The 100+ samples in this set allow for single variable comparisons under multiple conditions. Findings include:

Samples with annealed level primer thicknesses were commonly damaged by flash processing; some damage/hazing also was observed in the 30% primer increase samples;

Samples with VT level primers were far off in transmitted color (high in Tb*) if flashed heavily enough to improve transmissivity;

Increases in TL* as high as 2.3 points were produced using multiple flashes and as high as a 1.4 increase with a single flash (relative to the production SOLARBAN® 70XL on 5 mm clear baseline sample);

Flash processed samples were more optically similar to annealed stacks than as VT stacks; and Thinner oxides would be necessary to maintain color;

Thicker silver layers would be necessary to maintain color (largest increase to bottom Ag, smallest increase to top Ag).

Figure 18:
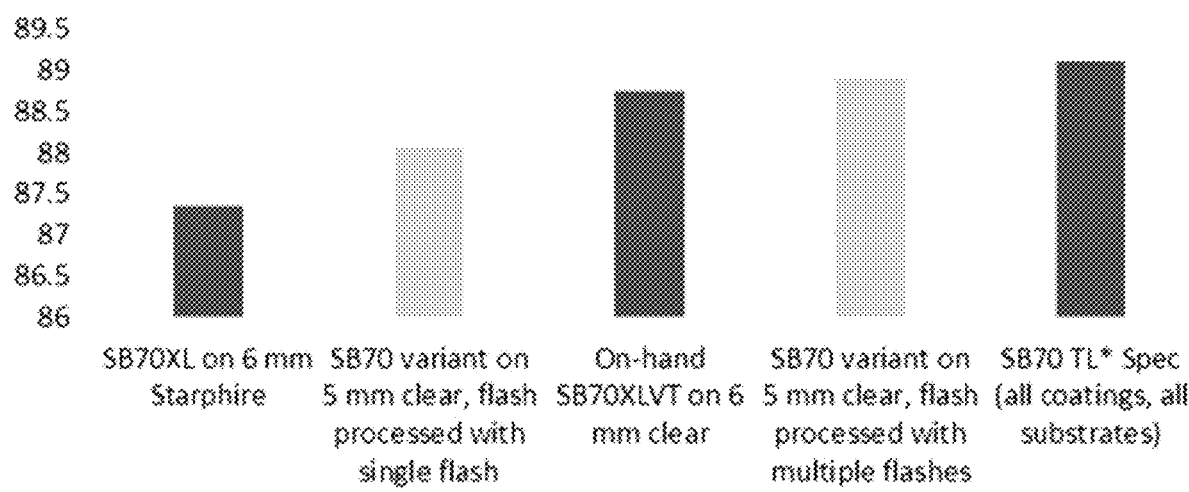
FIG. 18 is a graph comparing various samples as described in Example 8.

FIG. 18 compares TL* values between flash processed samples, SOLARBAN® 70 spec, and relevant production coatings. The 'single flash' sample was 35C-3 (baseline silver thickness, 50% primer intermediacy), and the multiple flash sample was 35C-5. Both of these samples had notably higher TL* values than did the SOLARBAN® 70XL on STARPHIRE® sample; it should be noted that the flashed sample were on 5 mm clear, and an extra mm of clear would be expected to further reduce TL* of the flashed samples by about 0.1.

A number of the samples (27C through 31C, all flash processes) were assessed using computer modeling and were determined to be amenable to such computer-based optimization processes. The samples were characterized and the layer move % s were recorded. Table 4 below shows the suggested layer move % for each layer from all the characterized -C samples in the 27C-31C (along with the baseline 21C-C sample). "Nominal move" refers to the % change relative to baseline power levels used for each sample (numbers were not exactly 1%, 2%, and 3% as the cathode powers were adjusted in increments of 0.1 kW; actual adjustments used are listed in the table). "Ti primer 22% over annealed level" indicates that these are the 40% primer intermediacy samples; 22% increase is close to 40% of the way from annealed to the 56% increase needed to reach VT primer thickness. The "suggested move" cells add the nominal move value to the to the estimated thickness adjustment needed to retain color; assuming self-consistent behavior, these numbers should ideally remain constant even as continuous silver thicknesses change (e.g., if the required thickness adjustment at baseline silver thickness is an increase of 2%, self-consistent behavior would expect the estimated required thickness adjustment after a 2% increase to be 0%. 0%+2% and 2%+0% would give the same resulting "Suggested Move" value).

The results indicated a fair degree of self consistency, with the thickness adjustments needed to retain the SOLARBAN® 70XL aesthetic varying within a much smaller range (~1%) relative to the changes implemented into the actual silver layers. The final block of numbers shown, "Adjusted 'Intrinsic' Move", normalizes the estimated layer thickness adjustments required by the corresponding layer thickness adjustment required for the baseline sample. The most significant effect of this is on the center silver, where a 2.2% increase in center silver is estimated to be needed based on the optics. The intent of this bottom set of numbers is to describe a hypothetical move that would adjust a stack that is optimized in its as-deposited state to one that is optimized for a specific flash process (the previous "Suggested Move" number set is optimized to adjust relative to the arbitrarily used baseline stack, which can be assumed to be off thickness in several places by modest amounts even while in color).

TABLE 4

| | Baseline | Control samples (unflashed) | | | | |
|---|---|---|---|---|---|---|
| Layer | 21C-C | 27C-C | 28C-C | 29C-C | 30C-C | 31C-C |
| Base | 3.4 | 3.3 | 3.3 | 3.6 | 3 | 3 |
| Bottom Ag | -0.4 | -0.1 | -1.9 | -2 | -4.4 | -3 |

TABLE 4-continued

| | | | | | | |
|---|---|---|---|---|---|---|
| BC | 0 | −1.1 | −1.1 | −0.8 | −1 | −1.3 |
| Center Ag | 2.2 | 1.1 | 0.1 | −1 | −1.8 | −1.5 |
| TC | −0.5 | −0.7 | −0.1 | −0.4 | −0.5 | −0.4 |
| Top Ag | 0.5 | 0.1 | −0.9 | −1.9 | −2.7 | −1.1 |
| Top | −2.2 | −4.3 | −4.3 | −4.5 | −4.4 | −4 |

Nominal Move (Ti primer 22% over annealed level)

| | | | | | |
|---|---|---|---|---|---|
| B Ag | 0 | 0.72 | 1.45 | 2.9 | 1.45 |
| C Ag | 0 | 1.25 | 1.88 | 2.5 | 1.88 |
| T Ag | 0 | 0.95 | 1.9 | 2.86 | 0.95 |

Suggested Move | | | | | AVG

| | | | | | | |
|---|---|---|---|---|---|---|
| B Ag | −0.1 | −1.18 | −0.55 | −1.5 | −1.55 | −0.976 |
| C Ag | 1.1 | 1.35 | 0.88 | 0.7 | 0.38 | 0.882 |
| T Ag | 0.1 | 0.05 | 0 | 0.16 | −0.15 | 0.032 |

Adjusted "Intrinsic" Move | | | | | AVG

| | | | | | | |
|---|---|---|---|---|---|---|
| B Ag | 0.3 | −0.78 | −0.15 | −1.1 | −1.15 | −0.576 |
| C Ag | −1.1 | −0.85 | −1.32 | −1.5 | −1.82 | −1.318 |
| T Ag | −0.4 | −0.45 | −0.5 | −0.34 | −0.65 | −0.468 |

Figure 19:
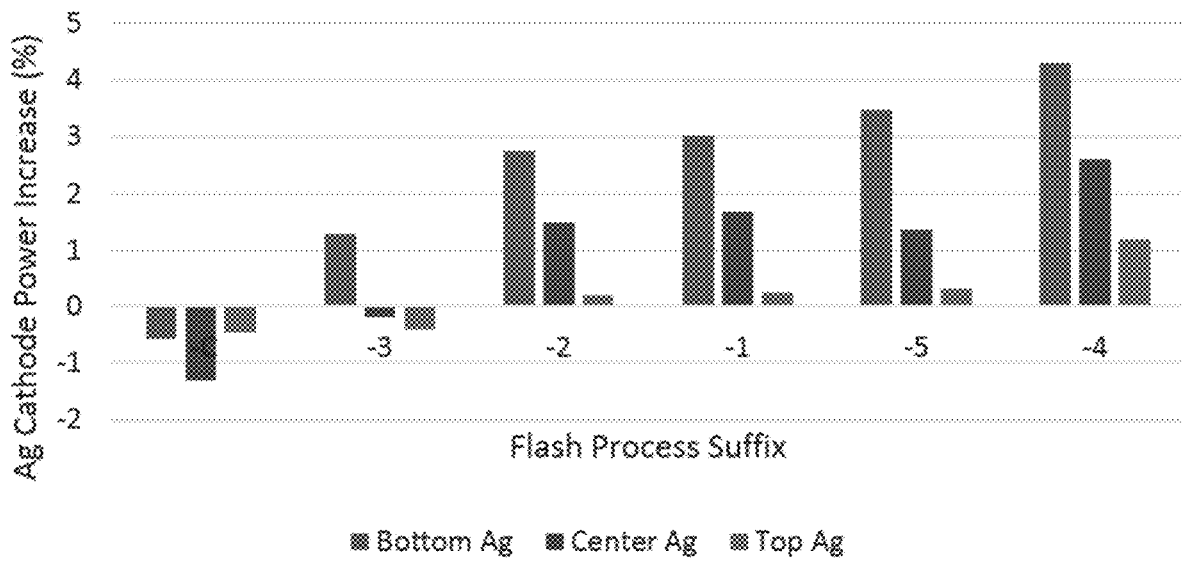
FIG. 19 is a graph comparing calculated adjustments to silver deposition conditions to achieve a target color match.

From the tables, average 'intrinsic' silver layer thickness change requirement that were calculated were compiled and compared between flash processes; the results are shown in FIG. 19. For the unflashed samples (-C), the suggested moves are thickness reductions. This is interpreted as the model fitting metallic Ti as excess Ag; in this interpretation, it seems possible that some metallic Ti remains in the −3 samples as well (two of the moves are still reductions). The other flash processes result in similar counterintuitive thickness adjustment estimates: increase the bottom silver by 2.5-4.5%, the center silver by 1.2-2.5%, and the top silver by 0.2-1.2%.

Figure 20:
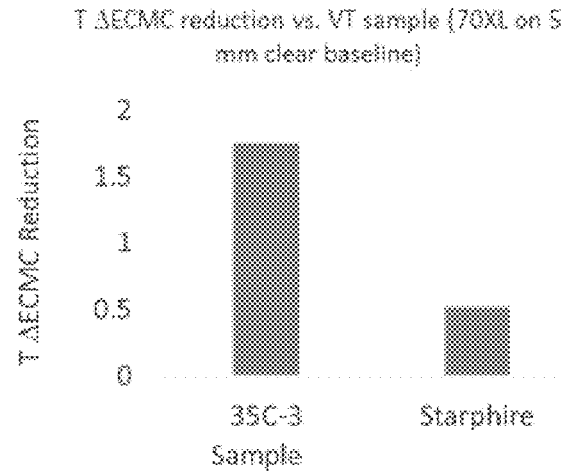
FIG. 20 is a graph comparing reduction in $\Delta E_{cmc}$ for a tested sample as compared to SOLARBAN® 70XL on STARPHIRE®.

$\Delta E_{cmc}$ is a measure of the overall difference between color profiles of two articles. $\Delta E_{cmc}$ was determined for sample 35C-3 and for SOLARBAN® 70XL on STARPHIRE® as compared to SOLARBAN® 70VT. FIG. 20 shows that the 35C-3 sample is a significantly closer color match to the tempered product than SOLARBAN® 70XL on STARPHIRE®.

Example 9

A four silver layer article, with a single discontinuous (subcritical) silver layer was prepared essentially as described above, e.g. in reference to FIGS. 3 and 4, and corresponding to commercial SOLARBAN® 90-based coatings, with the goal of determining whether a TL* increase could be achieved and useful color profiles could be generated using single flashes, including 670V for 500 µs, 650V for 500 µs, 800V for 200 µs, or 500V for 2000 µs, without damage to the article. Although some flash conditions resulted in less-desirable, e.g., high b* (yellowing) CIELAB L*a*b* profiles, transmittance generally increased and the color profile was responsive to the flash processing, with a reduction in haze with increasing primer thicknesses.

The following clauses provide examples of various aspects of the disclosure:

1. A method of producing a coated substrate comprising a layer comprising a transparent conductive oxide or a semiconductor, comprising:
   a. depositing over at least a portion of a substrate in an inert atmosphere a transparent metal oxide or semiconductor layer having an absorption coefficient at a wavelength in the visible spectrum of at least 1,000 $cm^{-1}$; and
   b. flashing at least a portion of the transparent conductive oxide or semiconductor layer at a temperature ranging from 15° C. to 40° C., or ranging from 20° C. to 30° C., with a pulse ranging from 3.5 J/cm² to 6.0 J/cm², of non-coherent light within the visible spectrum including light the wavelength in the visible spectrum at which the layer has an absorption coefficient of at least 1,000 $cm^{-1}$.

2. The method of clause 1, wherein the pulse has a penetration depth in the layer that is less than the thickness of the layer producing a split layer of the transparent conductive oxide or semiconductor, where each layer of the split layer has a different physical property.

3. The method of clause 1 or 2, wherein the pulse ranges from 4.0 J/cm² to 5.0 J/cm².

4. The method of clause 1 or 2, wherein the transparent conductive oxide or semiconductor layer comprises a transparent conductive oxide.

5. The method of clause 4, wherein the transparent conductive oxide is an oxide of titanium, hafnium, zirconium, niobium, zinc, bismuth, lead, indium, tin, and mixtures thereof.

6. The method of clause 4, wherein the transparent conductive oxide is indium tin oxide, indium zinc oxide, aluminum zinc oxide, zinc tin oxide, indium cadmium oxide, cadmium tin oxide, barium stannate, strontium vanadate, or calcium vanadate.

7. The method of any one of clauses 4-6, wherein the TCO is deposited in an atmosphere of from 2 mTorr to 5 mTorr, or from 3 mTorr to 4 mTorr.

8. The method of any one of clauses 4-7, wherein the TCO is deposited in an atmosphere comprising from 3% (by volume) or less of oxygen, 2.5% or less oxygen, for example 2.5% oxygen, less than 2.5% oxygen, or 1.5% or less of oxygen.

9. The method of clause 4, wherein the transparent conductive oxide is indium tin oxide.

10. The method of clause 9, wherein the indium tin oxide is deposited in an inert atmosphere with less than 2.5% oxygen.

11. The method of clause 9 or 10, wherein the indium tin oxide is deposited at a pressure ranging from 2 mTorr to 5 mTorr, or from 3 mTorr to 4 mTorr.

12. The method of any one of clauses 9-11, wherein the indium tin oxide is deposited in a layer having a thickness ranging from 150 nm to 400 nm, or from 200 nm to 300 nm, or 250 nm.
13. The method of any one of clauses 9-11, wherein the indium tin oxide is deposited in a layer having a thickness ranging from 300 nm to 2 μm, and the penetration depth of the flash is less than the thickness of the indium tin oxide layer, producing a split layer of the transparent conductive oxide or semiconductor, where each layer of the split layer has a different physical property.
14. The method of any one of clauses 1-13, wherein the transparent conductive oxide or semiconductor layer comprises an oxygen-deficient transparent conductive oxide.
15. The method of any one of clauses 1-14, wherein the substrate is transparent.
16. The method of any one of clauses 1-14, wherein the substrate is a glass or a plastic material.
17. The method of clause 1 or 2, wherein the transparent conductive oxide or semiconductor layer comprises indium tin oxide deposited in a layer having a thickness ranging from 150 nm to 400 nm, or from 200 nm to 300 nm, or 250 nm, in an atmosphere comprising from 3% or less of oxygen, 2.5% or less oxygen, for example 2.5% oxygen, less than 2.5% oxygen, or 1.5% or less of oxygen, at a pressure ranging from 2 mTorr to 5 mTorr, or from 3 mTorr to 4 mTorr.
18. The method of any one of clauses 1-17, wherein the pulse is a single pulse.
19. A transparent article comprising:
    a. a substrate; and
    b. a layer comprising a transparent conductive oxide or semiconductor over at least a portion of the substrate, comprising a first sub-layer having a first sheet resistance and a second sub-layer immediately over the first sub-layer having a second sheet resistance that is lower than the first sheet resistance.
20. The method of clause 19, wherein the transparent conductive oxide or semiconductor comprises indium tin oxide.
21. The method of clause 20, wherein the layer comprising the transparent conductive oxide or semiconductor has a thickness ranging from 300 nm to 2 μm.
22. A method of producing a coated substrate comprising a transparent conductive oxide layer, comprising:
    a. depositing a stack of thin layers on a substrate, the stack comprising at least a transparent conductive oxide layer or a semiconductor layer over at least a portion of the substrate; and
    b. flashing the coated substrate at a temperature ranging from 10° C. to 50° C., or ranging from 20° C. to 30° C., with a single flash of non-coherent light in the visible spectrum with an intensity ranging from 1 J/cm$^2$ to 10 J/cm$^2$ for a pulse length of up to 10 ms, wherein a mask is placed between the light source and the stack of thin layers such that at least a portion of the flash is masked such that light from the flash is partially blocked by the mask from reaching the stack of thin layers, and reaches only a portion of the stack of thin layers, thereby producing a pattern of reflected color, transmitted color, differential sheet resistance, and/or emissivity in the stack of thin layers.

It will be readily appreciated by those skilled in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

We claim:

1. A method of producing a coated glass substrate comprising a layer comprising a transparent conductive oxide, comprising:
   a. vacuum depositing over at least a portion of a substrate in an inert atmosphere comprising oxygen within a range of from 0 to 2.5%, an oxygen-deficient sub-stoichiometric transparent metal oxide layer having an absorption coefficient at a wavelength in the visible spectrum of at least 1,000 cm$^{-1}$, wherein the oxygen-deficient sub-stoichiometric transparent metal oxide layer comprises a transparent conductive oxide comprising indium tin oxide; and
   b. annealing at least a portion of the oxygen-deficient sub-stoichiometric transparent metal oxide layer by flashing at least a portion of the transparent conductive oxide layer at a temperature ranging from 15° C. to 40° C., with a pulse energy ranging from 3.5 J/cm$^2$ to 6.0 J/cm$^2$, of non-coherent light within the visible spectrum including light at a wavelength at which the layer has an absorption coefficient of at least 1,000 cm$^{-1}$,
   wherein the pulse of non-coherent light has a voltage of at least 500 V and up to 540 V and a pulse length of 2,000 μs, or wherein the pulse of non-coherent light has a voltage of greater than 540 V and less than 600 V and a pulse length of 1,000 μs, or wherein the pulse of non-coherent light has a voltage of at least 600 V and less than 650 V and a pulse length of 500 μs, or wherein the pulse of non-coherent light has a voltage of at least 650 V and less than 700 V and a pulse length of 400 μs, or wherein the pulse of non-coherent light has a voltage of at least 700 V and up to 730 V and a pulse length of 300 μs, and
   wherein the pulse has a penetration depth in the transparent metal oxide layer that is less than the thickness of the layer producing a split layer of the portion of the transparent conductive oxide layer, where each layer of the split layer has a different physical property.

2. The method of claim 1, wherein the pulse ranges from 4.0 J/cm$^2$ to 5.0 J/cm$^2$.

3. The method of claim 1, wherein the transparent conductive oxide layer is deposited in an atmosphere of from 2 mTorr to 5 mTorr.

4. The method of claim 1, wherein the indium tin oxide is deposited in an inert atmosphere with less than 2.5% oxygen, at a pressure ranging from 2 mTorr to 5 mTorr and/or wherein the indium tin oxide is deposited in a layer having a thickness ranging from 150 nm to 400 nm.

5. The method of claim 1, wherein the indium tin oxide is deposited in a layer having a thickness ranging from 300 nm to 2 μm, and the penetration depth of the flash is less than the thickness of the indium tin oxide layer, producing a split layer of the transparent conductive oxide layer, where each layer of the split layer has a different physical property.

6. The method of claim 1, wherein the substrate is transparent.

7. The method of claim 1, wherein the transparent conductive oxide layer comprises indium tin oxide deposited in a layer having a thickness ranging from 150 nm to 400 nm.

8. The method of claim 1, wherein the pulse is a single pulse.

9. The method of claim 1, wherein a mask is placed between the light source and the transparent metal oxide layer such that at least a portion of the flash is masked such that light from the flash is partially blocked by the mask from reaching the transparent metal oxide layer, and reaches only a portion of the transparent metal oxide layer, thereby producing a pattern of reflected color, transmitted color, differential sheet resistance, and/or emissivity in the transparent metal oxide layer.

\* \* \* \* \*